US012666737B2

(12) United States Patent
Kim et al.

(10) Patent No.: US 12,666,737 B2
(45) Date of Patent: Jun. 23, 2026

(54) IMAGE SENSOR

(71) Applicant: Samsung Electronics Co., Ltd., Suwon-si (KR)

(72) Inventors: Junghyun Kim, Suwon-si (KR); Jonghoon Park, Suwon-si (KR); Yunki Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 297 days.

(21) Appl. No.: 18/526,322

(22) Filed: Dec. 1, 2023

(65) Prior Publication Data
US 2024/0321913 A1    Sep. 26, 2024

(30) Foreign Application Priority Data

Mar. 22, 2023    (KR) ........................ 10-2023-0037536

(51) Int. Cl.
H10F 39/00        (2025.01)
H10F 39/18        (2025.01)

(52) U.S. Cl.
CPC ....... H10F 39/8057 (2025.01); H10F 39/182 (2025.01)

(58) Field of Classification Search
CPC .. H10F 39/8057; H10F 39/182; H10F 39/807; H10F 39/813; H10F 39/18; H10F 39/802; H10F 39/8053; H10F 39/8063
See application file for complete search history.

(56) References Cited

U.S. PATENT DOCUMENTS

| | | | | |
|---|---|---|---|---|
| 9,025,063 | B2 | 5/2015 | Ahn et al. | |
| 9,609,250 | B2 | 3/2017 | Lee et al. | |
| 10,998,365 | B2 | 5/2021 | Pyo et al. | |
| 12,433,052 | B2 * | 9/2025 | Lee ..................... | H10F 39/8053 |
| 2018/0090534 | A1 * | 3/2018 | Kim ..................... | H10F 39/8037 |
| 2019/0165018 | A1 * | 5/2019 | Park ..................... | H10F 39/813 |
| 2020/0176492 | A1 * | 6/2020 | Huang ............... | H10F 39/8023 |
| 2020/0219925 | A1 * | 7/2020 | Jang ..................... | H10F 39/813 |
| 2021/0144321 | A1 * | 5/2021 | Yamashita ........... | H10F 39/802 |
| 2021/0343765 | A1 * | 11/2021 | Gu ..................... | H10F 39/8027 |
| 2022/0109015 | A1 | 4/2022 | Jung et al. | |
| 2022/0130876 | A1 | 4/2022 | Park et al. | |

(Continued)

FOREIGN PATENT DOCUMENTS

| | | |
|---|---|---|
| JP | 2021/097241 A | 6/2021 |
| KR | 101967835 B1 | 4/2019 |

*Primary Examiner* — Victor A Mandala
(74) *Attorney, Agent, or Firm* — HARNESS, DICKEY & PIERCE, P.L.C.

(57) ABSTRACT

An image sensor may include four unit pixels constituting a shared pixel in a 2*2 structure; and a Deep Trench Isolation (DTI) structure isolating the four unit pixels from each other. The DTI structure may include an inner DTI structure inside the shared pixel and an outer DTI structure surrounding the shared pixel. The inner DTI structure may include a first DTI structure passing through a center of the shared pixel and extending in a first direction or a second direction and a second DTI structure extending toward the center of the shared pixel in a direction perpendicular to a direction in which the first DTI structure extends. The shared pixel may include a DTI Center Cut (DCC) region between the first DTI structure and the second DTI structure in a direction in which the second DTI structure extends.

20 Claims, 21 Drawing Sheets

(56)                        References Cited

U.S. PATENT DOCUMENTS

| | | | |
|---|---|---|---|
| 2022/0302191 A1* | 9/2022 | Jin | H10F 39/182 |
| 2022/0320154 A1 | 10/2022 | Tsai et al. | |
| 2023/0073145 A1* | 3/2023 | Kang | H10F 39/018 |
| 2023/0362500 A1* | 11/2023 | Shim | H04N 25/42 |
| 2024/0006445 A1* | 1/2024 | Suzuki | H10F 39/199 |
| 2024/0038808 A1* | 2/2024 | Tanoue | H10F 39/813 |
| 2024/0105749 A1* | 3/2024 | Lee | H10F 39/199 |
| 2024/0153974 A1* | 5/2024 | Kim | H10F 39/807 |
| 2024/0413176 A1* | 12/2024 | Osawa | H10F 39/813 |
| 2025/0221064 A1* | 7/2025 | Cho | H04N 25/78 |
| 2025/0275266 A1* | 8/2025 | Okuno | H10F 39/8037 |
| 2025/0359383 A1* | 11/2025 | Chuang | H10F 39/807 |

* cited by examiner

IMAGE SENSOR

CROSS-REFERENCE TO RELATED APPLICATION

This application is based on and claims priority under 35 U.S.C. § 119 to Korean Patent Application No. 10-2023-0037536, filed on Mar. 22, 2023, in the Korean Intellectual Property Office, the disclosure of which is incorporated by reference herein in its entirety.

BACKGROUND

Inventive concepts relate to an image sensor, and more particularly, to an image sensor including a deep trench isolation (DTI) structure in a shared pixel.

An image sensor may be configured by arranging a plurality of unit pixels in a two-dimensional array structure. In general, a unit pixel may include one photodiode and a plurality of pixel transistors. The pixel transistors may include, for example, a transfer transistor, a reset transistor, a source follower transistor, and a selection transistor. As pixel sizes have been miniaturized in recent years, a so-called shared pixel structure in which pixel transistors are shared by a plurality of pixels may be employed in an image sensor in to increase the area of a photodiode. In this shared pixel structure, individual pixels may be isolated from each other by a DTI structure.

SUMMARY

Inventive concepts provide an image sensor in which an overflow path is reduced while limiting and/or minimizing light loss.

In addition, aspects of inventive concepts are not limited to the aspects mentioned above, and other aspects may be clearly understood by those skilled in the art from the following description.

According to an embodiment of inventive concepts, an image sensor may include four unit pixels constituting a shared pixel in a 2*2 structure; and a Deep Trench Isolation (DTI) structure isolating the four unit pixels from each other. The DTI structure may include an inner DTI structure inside the shared pixel and an outer DTI structure surrounding the shared pixel. The inner DTI structure may include a first DTI structure and a second DTI structure. The first DTI structure may pass through a center of the shared pixel and may extend in a first direction or a second direction. The second direction may be perpendicular to the first direction. The second DTI structure may extends toward the center of the shared pixel in a direction perpendicular to a direction in which the first DTI structure extends. The shared pixel may include a DTI Center Cut (DCC) region between the first DTI structure and the second DTI structure in a direction in which the second DTI structure extends.

According to an embodiment of inventive concepts, an image sensor may include a plurality of unit pixels and a Deep Trench Isolation (DTI) structure separating the plurality of unit pixels from each other. The plurality of unit pixels each may include a photodiode (PD). The plurality of unit pixels may be arranged in groups of four unit pixels constituting a shared pixel in a 2*2 structure. The shared pixel may include at least two Floating Diffusion (FD) regions within the shared pixel, a Transfer Gate (TG) on each of the four unit pixels of the shared pixel and adjacent to one of the at least two FD regions, a Reset Gate (RG) on at least one of the four unit pixels of the shared pixel, a Source Follower Gate (SF) on at least one of the unit pixels adjacent to the RG and disposed on an outer portion of the shared pixel, and a DTI Center Cut (DCC) region. The DTI structure may include a first DTI structure and a second DTI structure. The first DTI structure may pass through a center of the shared pixel and may extend in a first direction or a second direction. The second direction may be perpendicular to the first direction. The second DTI structure may extend toward a center of the shared pixel in a direction perpendicular to a direction in which the first DTI structure extends. The DTI Center Cut (DCC) region may be between the first DTI structure and the second DTI structure in a direction in which the second DTI structure extends.

According to an embodiment of inventive concepts, an image sensor may include four unit pixels constituting a shared pixel in a 2*2 structure, and a Deep Trench Isolation (DTI) structure separating the four unit pixels from each other. The shared pixel may include at least two Floating Diffusion (FD) regions disposed within the shared pixel, and a Transfer Gate (TG) on each of the four unit pixels and disposed adjacent to one of the at least two FD regions, and a DTI Center Cut (DCC) region. The DTI structure may include a first DTI structure and a second DTI structure. The first DTI structure may pass through a center of the shared pixel and extend in a first direction or a second direction. The second direction may be perpendicular to the first direction. The first DTI structure may divide the shared pixel into two pixel pairs. The second DTI structure may extend toward the center of the shared pixel in a direction perpendicular to the direction in which the first DTI structure extends and may divide the pixel pair into two unit pixels among the four unit pixels of the shared pixel. The DTI Center Cut (DCC) region may be between the first DTI structure and the second DTI structure in the direction in which the second DTI structure extends.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
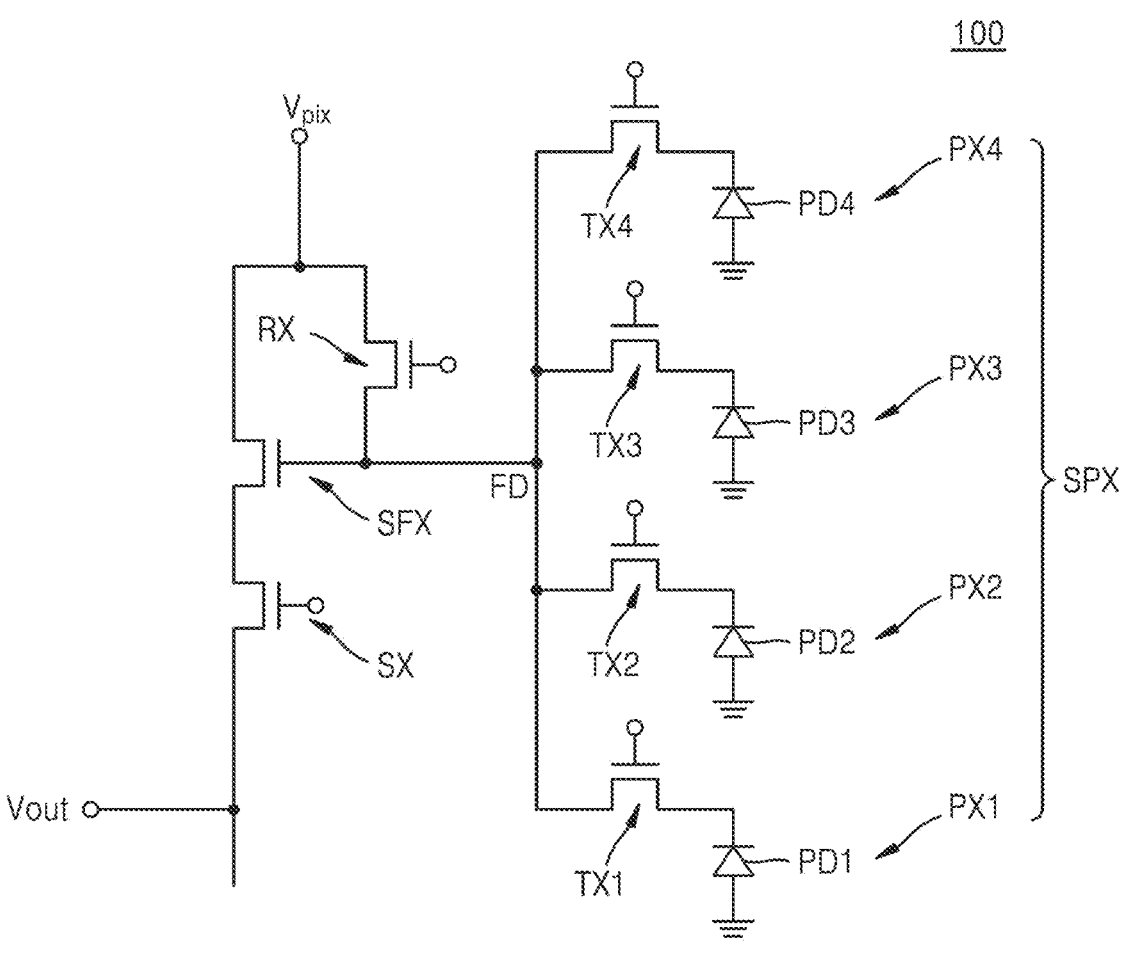
FIG. 1A is an equivalent circuit diagram corresponding to a shared pixel of an image sensor according to an embodiment.

Hereinafter, embodiments will be described in detail with reference to the accompanying drawings. The same reference numerals are used for the same components in the drawings, and duplicate descriptions thereof are omitted.

Figure 1B:
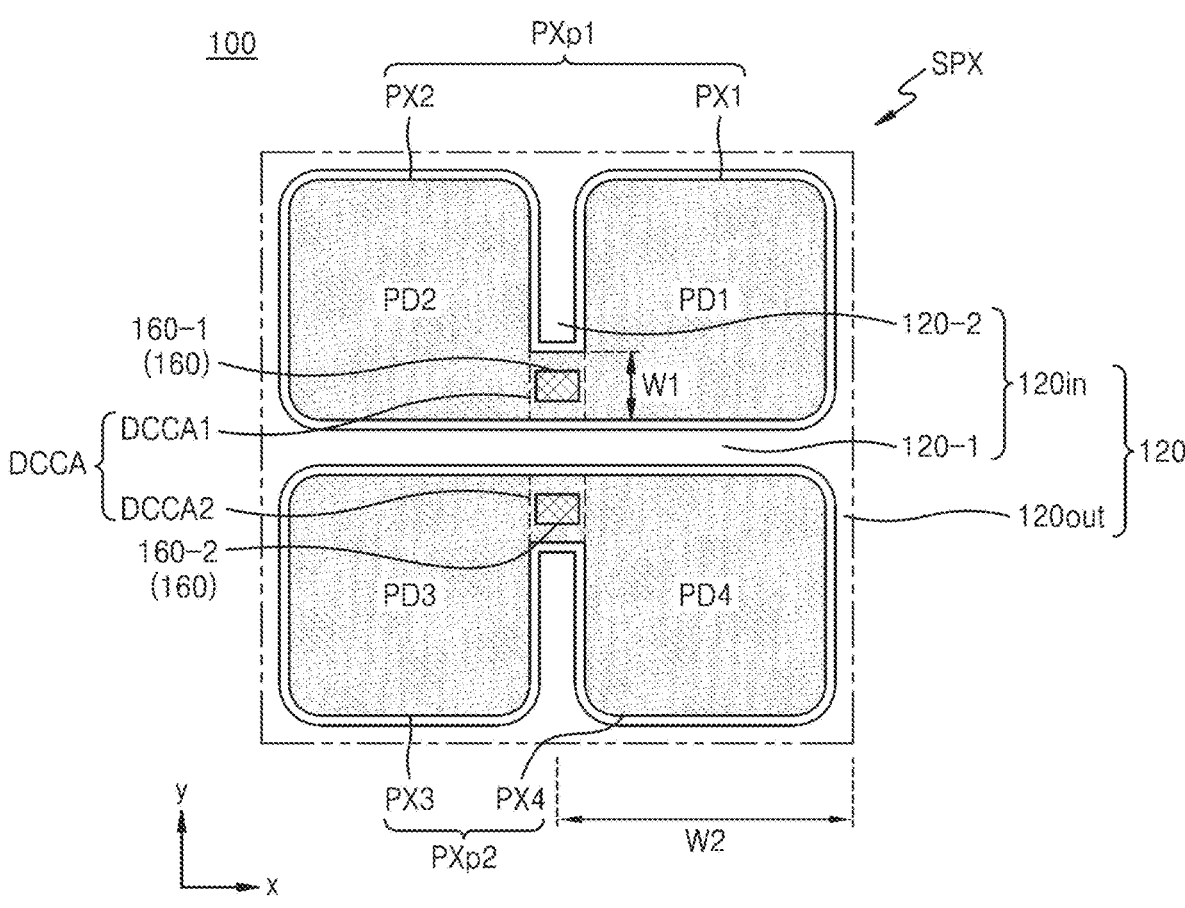
FIGS. 1B and 1C are plan views of shared pixels of the image sensor of FIG. 1A.
Figure 1C:
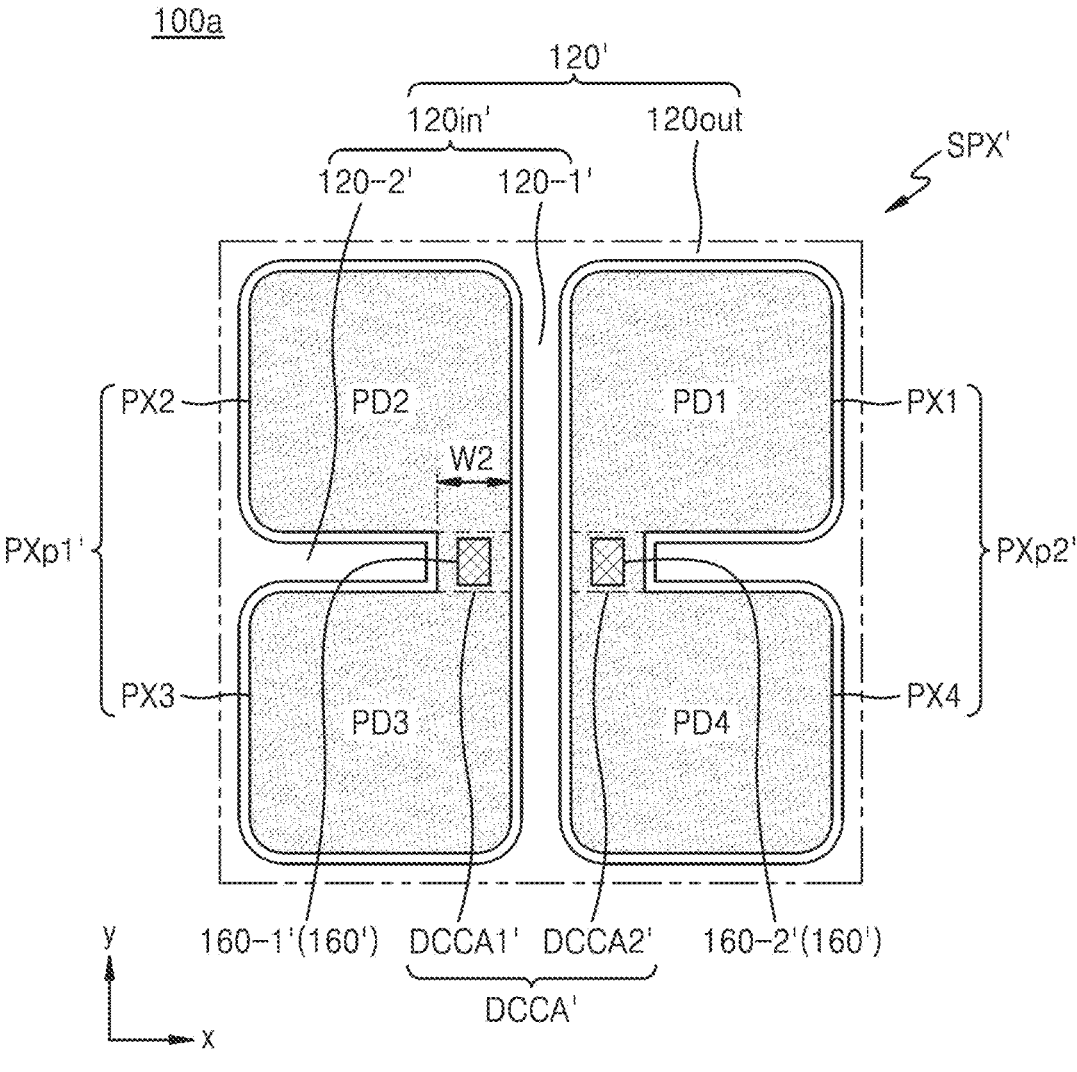

FIG. 1A is an equivalent circuit diagram corresponding to a shared pixel of an image sensor according to an embodiment, and FIGS. 1B and 1C are plan views of shared pixels of the image sensor of FIG. 1A.

Referring to FIGS. 1A and 1B, an image sensor 100 of this embodiment may include a plurality of shared pixels SPX disposed on a substrate in a two-dimensional array structure. The shared pixel SPX may include 4 unit pixels arranged in a 2*2 structure. For example, the four unit pixels may include first to fourth unit pixels PX1 to PX4.

Unit pixels may be separated from each other through a deep trench isolation (DTI) structure 120. The DTI structure 120 may extend between the unit pixels PX1 to PX4. In addition, a photodiode (PD) may be disposed inside each of the unit pixels. For example, a first PD PD1 is disposed on the first unit pixel PX1, a second PD PD2 is disposed on the second unit pixel PX2, a third PD PD3 may be disposed on the third unit pixel PX3, and a fourth PD PD4 may be disposed on the fourth unit pixel PX4. As shown in FIG. 1B, each of the unit pixels may have a substantially rectangular shape in a plan view. Accordingly, the PDs may each have a substantially rectangular shape in a plan view. However, the planar shapes of unit pixels and PDs are not limited to rectangles.

In addition, strictly distinguishing between a unit pixel and a PD, a unit pixel may be a concept including a PD, all or part of a Floating Diffusion (FD) region 160, and at least one of pixel transistors. Also, in the vertical structure, the pixel transistors may be disposed on a surface portion of the substrate 101 and the PD may be disposed inside the substrate 101. For example, the PD may be placed underneath the pixel transistors. Here, the pixel transistors may include, for example, a transfer transistor, a reset transistor, a source follower transistor, and a selection transistor. In the case of a transfer transistor, the PD and the FD region 160 may be connected to one another through a transfer gate having a vertical gate structure (refer to TG in FIG. 2A). In terms of a planar shape and a DTI separation structure, a unit pixel and a PD may be substantially the same. Therefore, below, the unit pixel and the PD may mean the same. In addition, at least one of the transistors disposed in some unit pixels is a dummy transistor and may not operate electrically. The pixel transistors are described in more detail in the description of FIGS. 2A to 2D.

The DTI structure 120 may include an inner DTI structure 120 in and an outer DTI structure 120 out. The inner DTI structure 120 in is disposed inside the shared pixel SPX and may separate unit pixels from each other. The inner DTI structure 120 in may include a first DTI structure 120-1 and a second DTI structure 120-2.

The first DTI structure 120-1 may extend in the x direction and divide the shared pixel SPX into two pixel pairs. For example, the two pixel pairs may include a first pixel pair PXp1 disposed on the upper side in the y direction and a second pixel pair PXp2 disposed on the lower side in the y direction. As shown in FIG. 1B, the first pixel pair PXp1 may be completely separated from the second pixel pair PXp2 by the first DTI structure 120-1.

The second DTI structure 120-2 may extend in the y direction and partially separate each of the pixel pairs into two unit pixels. For example, the second DTI structure 120-2 may partially divide the first pixel pair PXp1 into a first unit pixel PX1 and a second unit pixel PX2. Also, the second DTI structure 120-2 may partially separate the second pixel pair PXp2 into a third unit pixel PX3 and a fourth unit pixel PX4.

Accordingly, as shown in FIG. 1B, a DTI Center Cut (DCC) region DCCA may be disposed between the first DTI structure 120-1 and the second DTI structure 120-2 in the y direction from the central portion of the shared pixel SPX. The DCC region DCCA may include a first DCC region DCCA1 disposed in the first pixel pair PXp1 of the central portion of the shared pixel SPX and a second DCC region DCCA2 disposed in the second pixel pair PXp2 at the central portion of the shared pixel SPX. The first unit pixel PX1 and the second unit pixel PX2 of the first pixel pair PXp1 may be connected to each other through the first DCC region DCCA1. Also, the third unit pixel PX3 and the fourth unit pixel PX4 of the second pixel pair PXp2 may be connected to each other through the second DCC region DCCA2.

The width of the DCC region DCCA in the y direction may range from about 10% to about 90% of the size of a unit pixel. For example, the DCC region DCCA in the y direction may have a first width W1. The size of a unit pixel may be defined as a width in the x direction or the y direction. A unit pixel may have, for example, a second width W2. The first width W1 may have a range of about 10% to about 90% of the second width W2.

In the image sensor 100 of this embodiment, the DCC region DCCA may provide an overflow path between two adjacent unit pixels while limiting and/or minimizing light loss in the shared pixel SPX. For reference, in the case of a shared pixel structure of a general 2*2 structure, a DTI structure is formed in a '†' shape without a DDC region and light may be focused on the central portion of the shared pixel. Therefore, large optical loss may occur in the central portion of the shared pixel due to the '†' type DTI structure. In contrast, in the image sensor 100 of the present embodiment, since the DCC region DCCA is disposed in the central portion of the shared pixel SPX, light loss may be improved by the DCC region DCCA.

In addition, a structure in which a DCC region is disposed in the central portion of a shared pixel may be considered so that all four unit pixels are connected. However, in the case of such a structure, since four PDs are connected to each other and an overflow path occurs between the four PDs, it may be difficult to accurately sense the amount of charge generated in each of the PDs. In contrast, in the image sensor 100 of this embodiment, two pixel pairs may be completely separated from each other through the first DTI structure 120-1. Also, two unit pixels are partially separated through the second DTI structure 120-2, and a DCC region DCCA may be disposed between two adjacent unit pixels. Accordingly, the image sensor 100 of this embodiment may reduce the overflow path between the two PDs while limiting and/or minimizing light loss. Accordingly, it is possible to improve the sensing accuracy of the amount of charge in each of the PDs.

The outer DTI structure 120out may be disposed outside the shared pixel SPX by surrounding the periphery of the shared pixel SPX. The outer DTI structure 120out may separate shared pixels SPX adjacent in the x and y directions from each other. The internal structure of the DTI is described in more detail in the description of FIGS. 2A to 2D.

The shared pixel SPX may have a substantially rectangular shape in a plan view. However, the planar shape of the shared pixel SPX is not limited to a rectangle. A microlens may be disposed on each unit pixel of the shared pixel SPX, or a microlens may be disposed on the entire shared pixel SPX. The arrangement structure of the shared pixel SPX and the microlens is described in more detail in the description of FIGS. 6A and 6B.

One color filter may be disposed in the shared pixel SPX. However, according to embodiments, a plurality of color filters may be disposed in the shared pixel SPX. Also, some of the same color filters may be disposed in the shared pixel SPX. The arrangement structure of the shared pixel SPX and the color filter is described in more detail in the description of FIGS. 7A to 7D.

The FD region 160 may be disposed in the DCC region DCCA of each pair of pixels in the center of the shared pixel SPX. For example, a first FD region 160-1 is disposed in the first DCC region DCCA1 of the first pixel pair PXp1 and the second FD region 160-2 may be disposed in the second DCC region DCCA2 of the second pixel pair PXp2. The first FD region 160-1 may be shared by the first PD PD1 of the first unit pixel PX1 and the second PD PD2 of the second unit pixel PX2, and the second FD region 160-2 may be shared by the third PD PD3 of the third unit pixel PX3 and the fourth PD PD4 of the fourth unit pixel PX4. In other words, the charges generated by the first PD PD1 and the second PD PD2 may accumulate in the first FD region 160-1 through the corresponding transfer transistor and the charges generated by the third PD PD3 and the fourth PD PD4 may accumulate in the second FD region 160-2 through the corresponding transfer transistors. Accordingly, in each of the unit pixels, a transfer gate (refer to TG in FIG. 2A) may be disposed between the PD and the FD region 160. The arrangement structure of the PD, the transfer gate TG, and the FD region 160 is described in more detail in the description of FIGS. 2A to 2D.

Although only one shared pixel SPX is shown in FIGS. 1A and 1B, the image sensor 100 of this embodiment may include a plurality of shared pixels SPX arranged in a 2D array structure. That is, in the image sensor 100 of this embodiment, a plurality of shared pixels SPX may be disposed in the x direction and the y direction, respectively. The 2D array structure of the shared pixels SPX is described in more detail in the description of FIGS. 5A to 5C.

Based on the equivalent circuit diagram of FIG. 1A, looking at the connection relationship between the PDs, the FD region 160, and the pixel transistors, the four PDs PD1 to PD4 may be connected to the source regions of the corresponding four transfer transistors TX1 to TX4, respectively. A drain region of each of the transfer transistors TX1 to TX4 may be connected to a source region of the reset transistor RX. The source region of the reset transistor RX may correspond to the FD region 160. As a result, the common drain region of the transfer transistors may correspond to the FD region 160. The FD region 160 may be connected to a source follower gate (see SF in FIG. 2A) of the source follower transistor SFX. As shown in FIG. 1A, the drain region of the reset transistor RX and the drain region of the source follower transistor SFX may be connected to the power supply voltage Vpix. Also, a source region of the source follower transistor SFX and a drain region of the selection transistor SX may be connected to each other. An output line is connected to the source region of the selection transistor SX so that the voltage of the source region of the selection transistor SX may be output as the output voltage Vout.

Referring to FIG. 1C, an image sensor 100a of this embodiment may be different from the image sensor 100 of FIG. 1B in a DTI structure 120' of a shared pixel SPX' and the shape of pixel pairs. Specifically, in the image sensor 100a of this embodiment, the shared pixel SPX' may include the DTI structure 120'. Also, the DTI structure 120' may include an inner DTI structure 120in' and an outer DTI structure 120out. The outer DTI structure 120out may be substantially the same as the outer DTI structure 120out of the DTI structure 120 of the image sensor 100 of FIG. 1B.

The inner DTI structure 120in' may include a first DTI structure 120-1' and a second DTI structure 120-2'. The first DTI structure 120-1' may extend in the y direction and completely separate the shared pixel SPX' into two pixel pairs. For example, through the first DTI structure 120-1', the shared pixel SPX' may be completely separated into a first pixel pair PXp1' and a second pixel pair PXp2'. As shown in FIG. 1C, the first pixel pair PXp1' includes a second unit pixel PX2 and a third unit pixel PX3, and a first DCC region DCCA1' may be disposed between the second unit pixel PX2 and the third unit pixel PX3. In addition, the second pixel pair PXp2' includes a fourth unit pixel PX4 and a first unit pixel PX1, and a second DCC region DCCA2' may be disposed between the fourth unit pixel PX4 and the first unit pixel PX1.

The second DTI structure 120-2' may extend in the x direction and partially separate each of the pixel pairs into two unit pixels. For example, the second unit pixel PX2 and the third unit pixel PX3 of the first pixel pair PXp1' may be partially separated by the second DTI structure 120-2', and the fourth unit pixel PX4 and the first unit pixel PX1 of the second pixel pair PXp2' may be partially separated by the second DTI structure 120-2'. A DCC region DCCA' may be disposed between the first DTI structure 120-1' and the second DTI structure 120-2' in the x direction. In addition, an FD region 160' may be disposed in the DCC region DCCA'. For example, a first FD region 160-1' may be disposed in the first DCC region DCCA1' and a second FD region 160-2' may be disposed in the second DCC region DCCA2'.

The shared pixel SPX' of the image sensor 100a of the present embodiment may correspond to a shape in which the shared pixel SPX of the image sensor 100 of FIG. 1B is rotated by 90°. Accordingly, the shape of the DTI structure 120' may also correspond to a shape in which the DTI structure 120 of the shared pixel SPX of the image sensor 100 of FIG. 1B is rotated by 90°. Specifically, the shape of the inner DTI structure 120in' of the DTI structure 120' may correspond to a shape in which the inner DTI structure 120in of the DTI structure 120 is rotated by 90°. Other widths and functions of the DCC region DCCA' are as described for the DCC region DCCA of the image sensor 100 of FIG. 1B.

In the image sensors 100 and 100a of this embodiment, the shared pixel SPX having the 2*2 structure may be completely separated into two pixel pairs by the first DTI structures 120-1 and 120-1' extending in the x direction or the y direction. Also, each of the pixel pairs may be partially divided into two unit pixels by the second DTI structures 120-2 and 120-2' extending in a direction perpendicular to the extending direction of the first DTI structures 120-1 and 120-1'. Based on these second DTI structures 120-2 and 120-2', in each of the pixel pairs, adjacent unit pixels may have a structure connected to each other through DCC regions DCCA and DCCA'. Therefore, based on the first DTI structures 120-1 and 120-1', the second DTI structures 120-2 and 120-2', and the DCC regions DCCA and DCCA', the image sensor 100 according to the present embodiment may improve the sensing accuracy of the amount of charge in each of the PDs by reducing the overflow path between the two PDs while limiting and/or minimizing light loss.

Figure 2A:
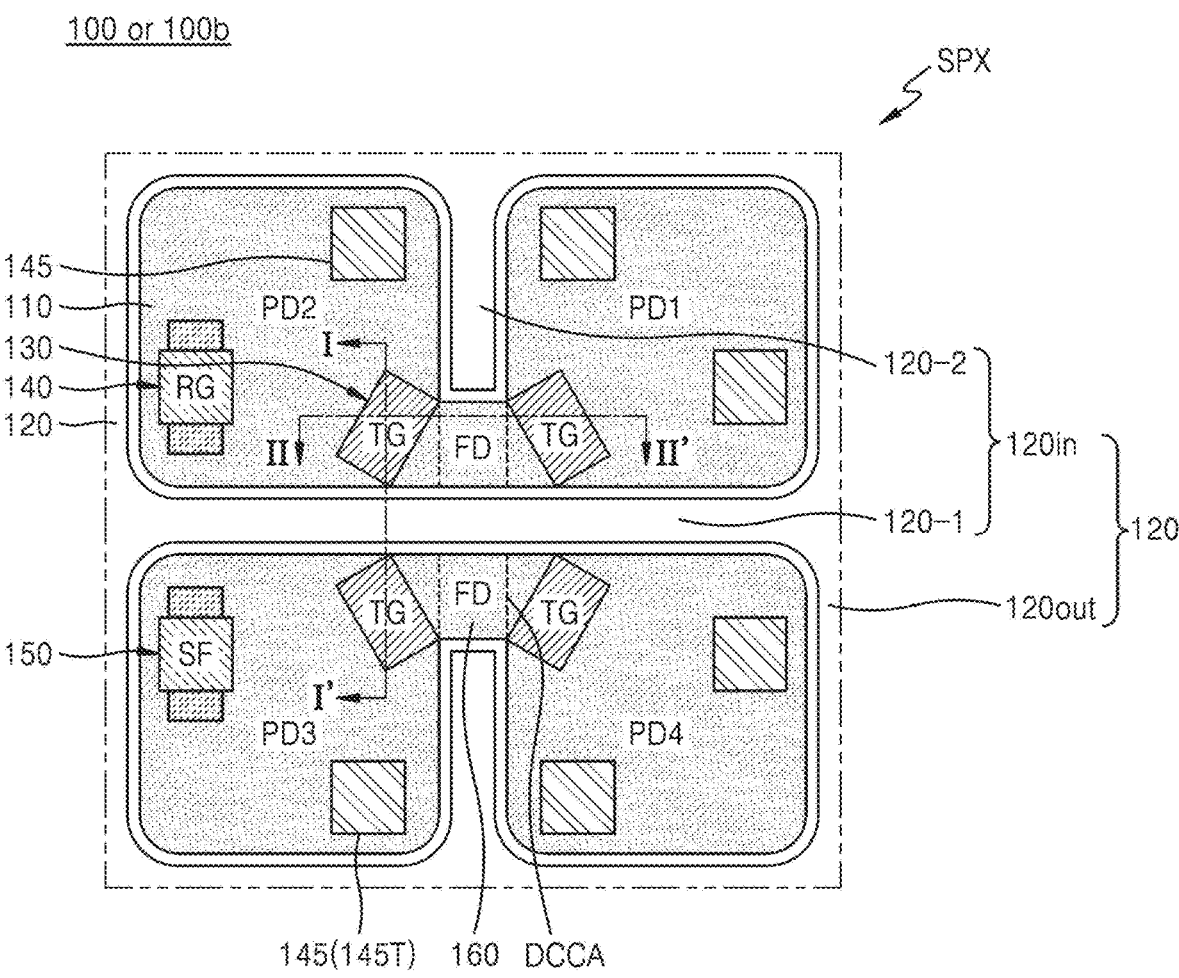
FIG. 2A is a plan view showing in more detail the shared pixels of the image sensor of FIG. 1B and FIGS. 2B and 2C are cross-sectional views showing a portion I-I' of FIG. 2A, respectively.
Figure 2B:
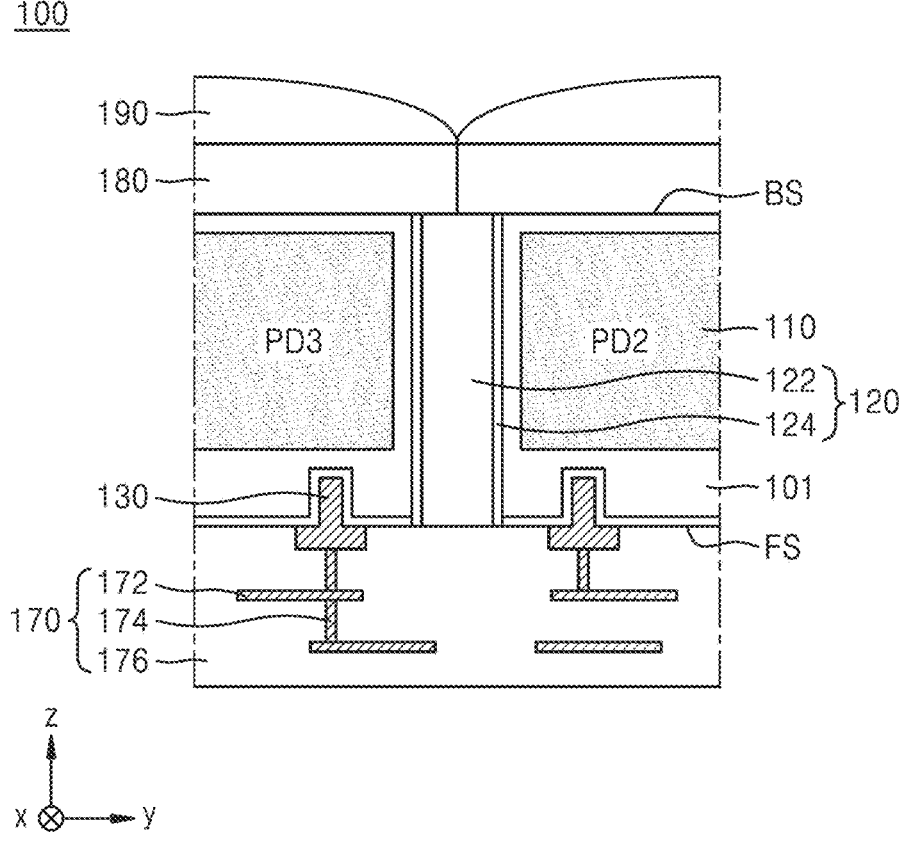
FIG. 2D is a cross-sectional view of a portion II-II' of FIG. 2A.
Figure 2C:
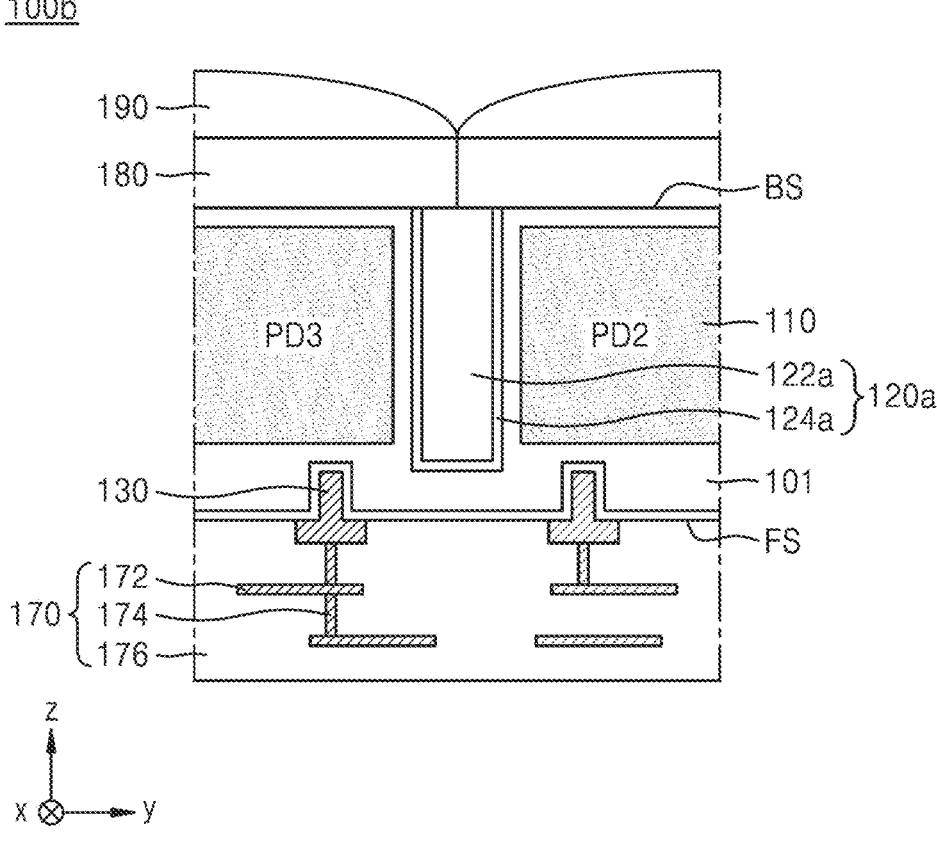
Figure 2D:
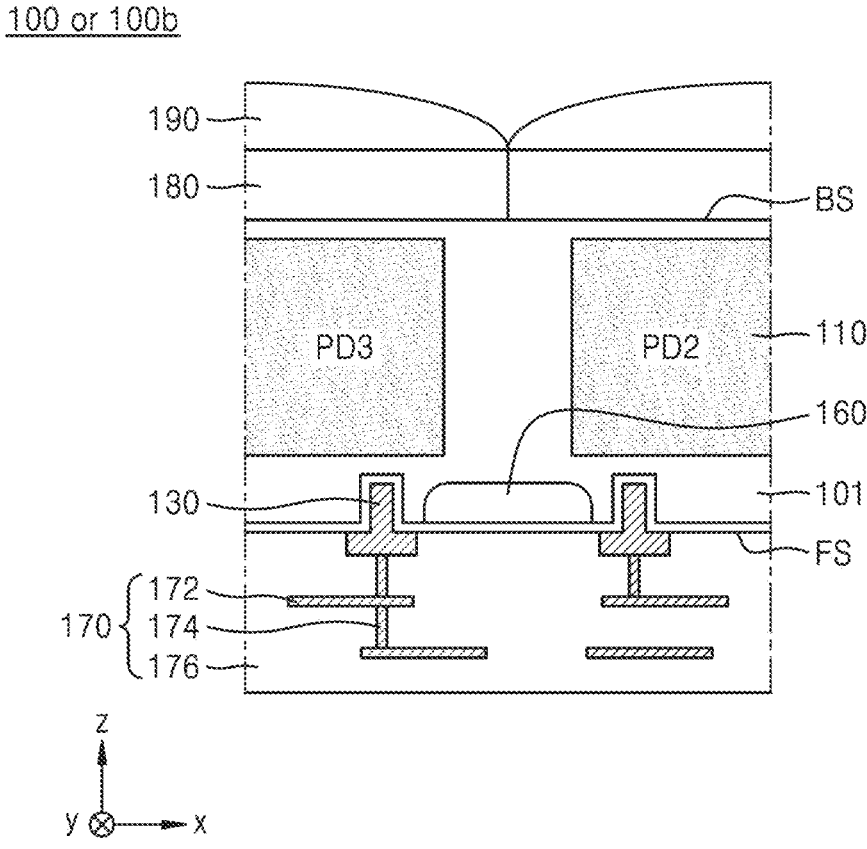

FIG. 2A is a plan view showing in more detail the shared pixels of the image sensor of FIG. 1B, FIGS. 2B and 2C are cross-sectional views each showing a section I-I' of FIG. 2A, and FIG. 2D is a cross-sectional view showing a section II-II' of FIG. 2A.

Referring to FIGS. 2A to 2D, image sensors 100 and 100b of this embodiment may include a substrate 101, a PD 110, a DTI structure 120 or 120a, pixel transistors 130, 140, and 150, an FD region 160, a multi-wiring layer 170, a color filter 180, and a microlens 190.

The substrate 101 may include, for example, a semiconductor material, such as silicon (Si), germanium (Ge), or Si—Ge, or a III-V compound, such as GaP, GaAs, or GaSb. In some embodiments, at least a portion of the substrate 101 may be a silicon-on-insulator (SOI) substrate or a germanium-on-insulator (GOI) substrate. In the image sensors 100 and 100b of this embodiment, the substrate 101 may be, for example, a Si substrate.

The PDs 110 may be disposed in the substrate 101. In addition, a multi-wiring layer 170 may be disposed on a lower surface of the substrate 101, and a color filter 180 and a microlens 190 may be disposed on an upper surface of the substrate 101. In the image sensors 100 and 100b of this embodiment, the lower surface of the substrate 101 may correspond to the frontside (FS) and the upper surface of the substrate 101 may correspond to the backside (BS). Accordingly, the image sensors 100 and 100b of this embodiment may have a Back-Side Illumination (BSI) structure in which light is incident to the BS.

The PDs 110 may be disposed within the substrate 101 and separated by the DTI structure 120 or 120a. The planar shape of the DTI structure 120 or 120a has been described in the description of FIGS. 1B and 1C. Regarding the vertical structure of the DTI structure 120 or 120a, the DTI structure 120 or 120a may have an FS DTI structure or a BS DTI structure. The FS DTI structure 120 refers to a structure formed by forming a trench in the FS of the substrate 101 and then filling the trench with a DTI material, and may be referred to as an FDTI structure. In contrast, the BS DTI structure 120 refers to a structure formed by forming a trench in the BS of the substrate 101 and then filling the trench with a DTI material, and may be referred to as an BDTI structure.

As shown in the image sensor 100 of FIG. 2B, the FS DTI structure 120 may have a structure completely penetrating the substrate 101. For example, in the case of the FS DTI structure 120, after forming the initial DTI structure, by exposing the lower surface of the DTI structure in the BS grinding process of the substrate 101, the FS DTI structure 120 may completely penetrate the substrate 101. In contrast, as shown in the image sensor 100b of FIG. 2C, the BS DTI structure 120a may have a structure penetrating only a portion of the substrate 101. For example, after the BS grinding process of the substrate 101, the BS DTI structure 120a is formed, considering damage to the multi-wiring layer 170 on the FS of the substrate 101, in the process of forming the trench, by keeping the Si on the FS side of the substrate 101 at a preset thickness, the BS DTI structure 120a may partially penetrate the substrate 101. However, in some embodiments, the BS DTI structure 120a may completely penetrate the substrate 101.

As shown in FIGS. 2B and 2C, the DTI structures 120 and 120a may include inner conductive layers 122 and 122a and outer insulating layers 124 and 124a. The inner conductive layers 122 and 122a are disposed in the central portion of the DTI structures 120 and 120a and may include a conductive material such as poly-Si or metal. The outer insulating layers 124 and 124a have a structure surrounding the inner conductive layers 122 and 122a and may insulate the inner conductive layers 122 and 122a from Si of the substrate 101. For example, the outer insulating layers 124 and 124a may include an insulating material such as an oxide film such as $SiO_2$, a nitride film such as SiNx, an oxynitride film, or a high dielectric film such as HfOx. However, the material of the outer insulating layers 124 and 124a is not limited to the above materials.

In the image sensors 100 and 100a of this embodiment, the DTI structures 120 and 120a may have a double-layer structure including two material layers. However, in the image sensor of this embodiment, the structure of the DTI structures 120 and 120a is not limited to the double layer structure. For example, in the image sensors 100 and 100a of this embodiment, the DTI structures 120 and 120a may have a single-layer structure of one insulating material layer or a multi-layer structure including three or more material layers.

The FD region 160 may be disposed between two adjacent unit pixels in the x direction, for example, in a DCC region DCCA. The FD region 160 may be formed by doping the Si portion of the FS of the substrate 101 at a high concentration with impurities. In the concept of a transistor, the FD region 160 may constitute a source/drain region of the transfer transistor 130. That is, the PD 110 and the FD region 160 constitute the source/drain region of the transfer transistor 130, and charges generated in the PD 110 through the switching action of the transfer gate TG may be transferred to the FD region 160 and stored in the FD region 160. The FD region 160 may be connected to the source/drain region of the reset transistor 140 and the source follower gate SF of the source follower transistor 150 through a wiring 172. A wiring connection relationship between the FD region 160, the reset transistor 140, and the source follower transistor 150 is described in more detail in the description of FIGS. 4A and 4B.

The multi-wiring layer 170 may be disposed on the FS of the substrate 101 and may include wirings 172, vertical vias 174, and interlayer insulating layers 176. As shown, the wirings 172 have a multilayer structure, and the wirings 172 adjacent in the z direction may be connected to each other through vertical vias 174. In addition, the wiring 172 may be connected to the gate and source/drain regions of the transistor through vertical vias 174. In FIGS. 2B and 2C, a structure in which the wiring 172 is connected to the gate of the transfer transistor 130 through the vertical via 174 is shown. The gate of the transfer transistor 130, that is, the transfer gate TG, may have a vertical gate structure in which a portion thereof is inserted into the substrate 101. In addition, the interlayer insulating layer 176 may include a nitride film, an oxide film, or an oxynitride film.

The color filter 180 may be disposed on the BS of the substrate 101. As shown in FIGS. 1B and 1C, one color filter 180 may be disposed in one unit pixel. However, the arrangement structure of the color filter 180 is not limited thereto. The arrangement structure of the color filter 180 is described in more detail in the description of FIGS. 7A to 7D.

The microlens 190 may be disposed on the color filter 180 on the BS of the substrate 101. As shown in FIGS. 1B and 1C, one microlens 190 may be disposed in one unit pixel. However, the arrangement structure of the microlenses 190 is not limited thereto. The arrangement structure of the microlenses 190 is described in more detail in the description of FIGS. 6A and 6B.

The shared pixel SPX may include pixel transistors. The pixel transistors may include, for example, a transfer transistor 130, a reset transistor 140, a source follower transistor 150, and a selection transistor. In FIG. 2A, the transfer gate TG of the transfer transistor 130, the reset gate RG of the reset transistor 140, and the source follower gate SF of the source follower transistor 150 are shown. The reset gate RG and the heavily doped regions disposed on both sides thereof may constitute the reset transistor 140, and the source follower gate SF and the heavily doped regions disposed on both sides thereof may constitute the source follower transistor 150.

As shown in FIG. 2A, at least one dummy gate 145 may be disposed in each unit pixel, in addition to the reset gate RG or the source follower gate SF. Such a dummy gate 145 may be used for various purposes. For example, in the image sensor 100 of this embodiment, the dummy gate 145 at the lower right of the third pixel PX3 may constitute the selection transistor 145T. Additionally, the dummy gate 145 may be used not only as a selection gate of the selection transistor 145T but also to implement other operating characteristics in the image sensor 100. For example, the dummy gate 145 may be used for dual conversion gain (CG) or triple CG implementation of a shared pixel. Here, the CG may refer to the rate at which the charge generated in the PD transfers to the FD region and accumulates, and the charge is converted into a voltage. In addition, the dummy gate 145 may be used as an additional source follower gate SF when configuring a plurality of source follower gates SF.

In the image sensor 100 of this embodiment, four unit pixels may constitute one shared pixel SPX. Accordingly, the shared pixel SPX may have a structure in which four PDs 110 share one FD region 160. However, in the image sensors 100 and 100b of this embodiment, due to the first DTI structure 120-1, two FD regions 160 are physically disposed, and the two FD regions 160 are connected through the wiring 172, so that one FD region 160 may be electrically configured. As may be seen from the equivalent circuit diagram of FIG. 1A, in the shared pixel SPX, sharing of one FD region 160 by four PDs 110 may be achieved through transfer transistors 130 corresponding to each PD 110.

Furthermore, the concept of sharing in the shared pixel SPX includes the meaning that four PDs 110 share one FD region and also the meaning that the four PDs 110 share the reset transistor 140, the source follower transistor 150, and the selection transistor. As described above, the selection transistor may be implemented by a dummy gate 145T disposed adjacent to the source follower transistor 150.

Figure 3:
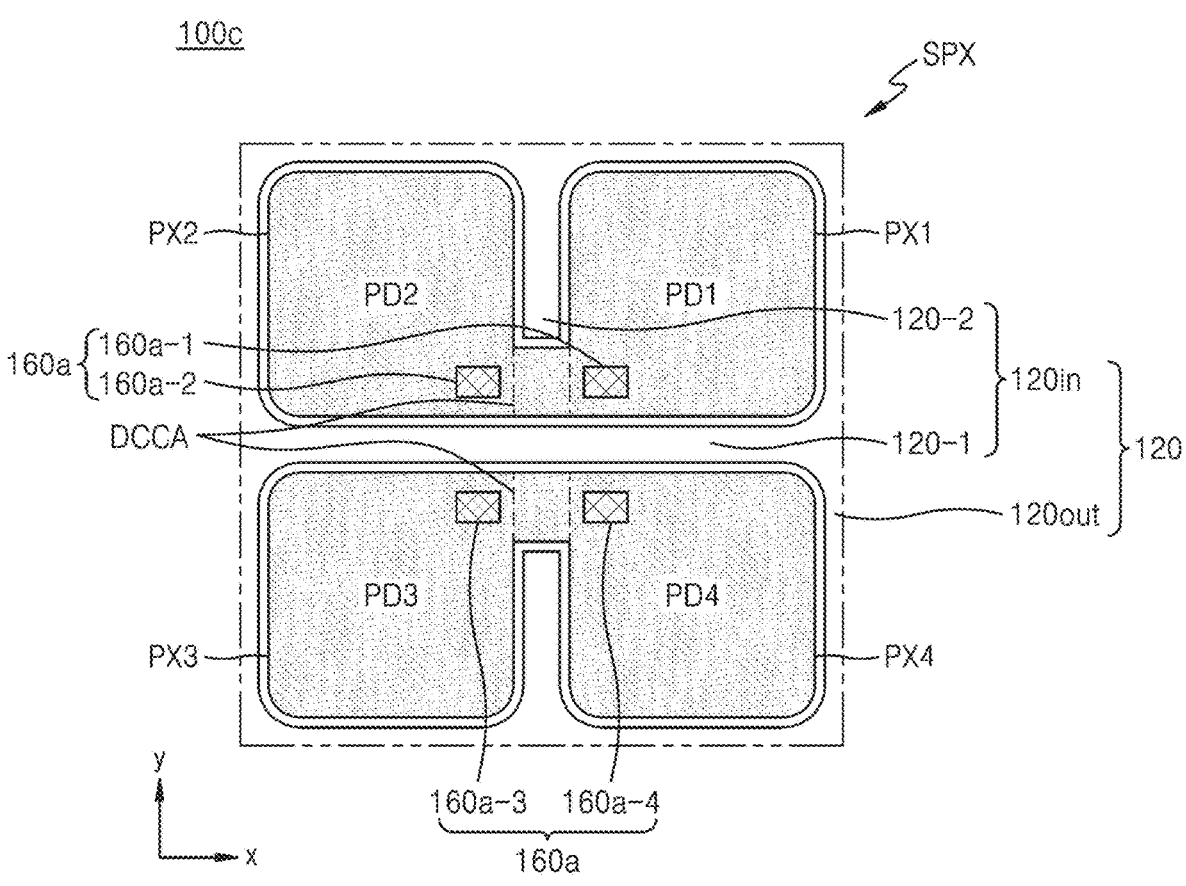
FIG. 3 is a plan view of a shared pixel of an image sensor according to an embodiment.

FIG. 3 is a plan view of a shared pixel of an image sensor according to an embodiment. The descriptions given above of FIGS. 1A to 2D are briefly given or omitted.

Referring to FIG. 3, an image sensor 100c of this embodiment may be different from the image sensor 100 of FIG. 1B in the structure of an FD region 160a. Specifically, in the image sensor 100c of this embodiment, the FD region 160a may be disposed in each of the unit pixels PX1 to PX4. For example, a first FD region 160a-1 may be adjacent to the DCC region DCCA and disposed on the first unit pixel PX1, a second FD region 160a-2 may be adjacent to the DCC region DCCA and disposed on the second unit pixel PX12, a third FD region 160a-3 may be disposed adjacent to the DCC region DCCA and disposed in the third unit pixel PX3, and a fourth FD region 160a-4 may be disposed on the fourth unit pixel PX4 adjacent to the DCC region DCCA. Thereafter, charges generated in the first PD PD1 of the first unit pixel PX1 accumulate in the first FD region 160a-1 through the corresponding transfer transistor, charges generated in the second PD PD2 of the second unit pixel PX2 accumulate in the second FD region 160a-2 through the corresponding transfer transistor, charges generated in the third PD PD3 of the third unit pixel PX3 accumulate in the third FD region 160a-3 through the corresponding transfer transistor, and charges generated in the fourth PD PD4 of the fourth unit pixel PX4 may accumulate in the fourth FD region 160a-4 through the corresponding transfer transistor.

Even in the image sensor 100c of this embodiment, based on the concept of the shared pixel SPX, the four FD regions 160a-1 to 160a-4 may be connected to each other through a wiring 172 and connected to the reset transistor 140 and the source follower transistor 150. A wiring connection relationship between the FD region 160a, the reset transistor 140, and the source follower transistor 150 is described in more detail in the description of FIGS. 4A and 4B.

Figure 4A:
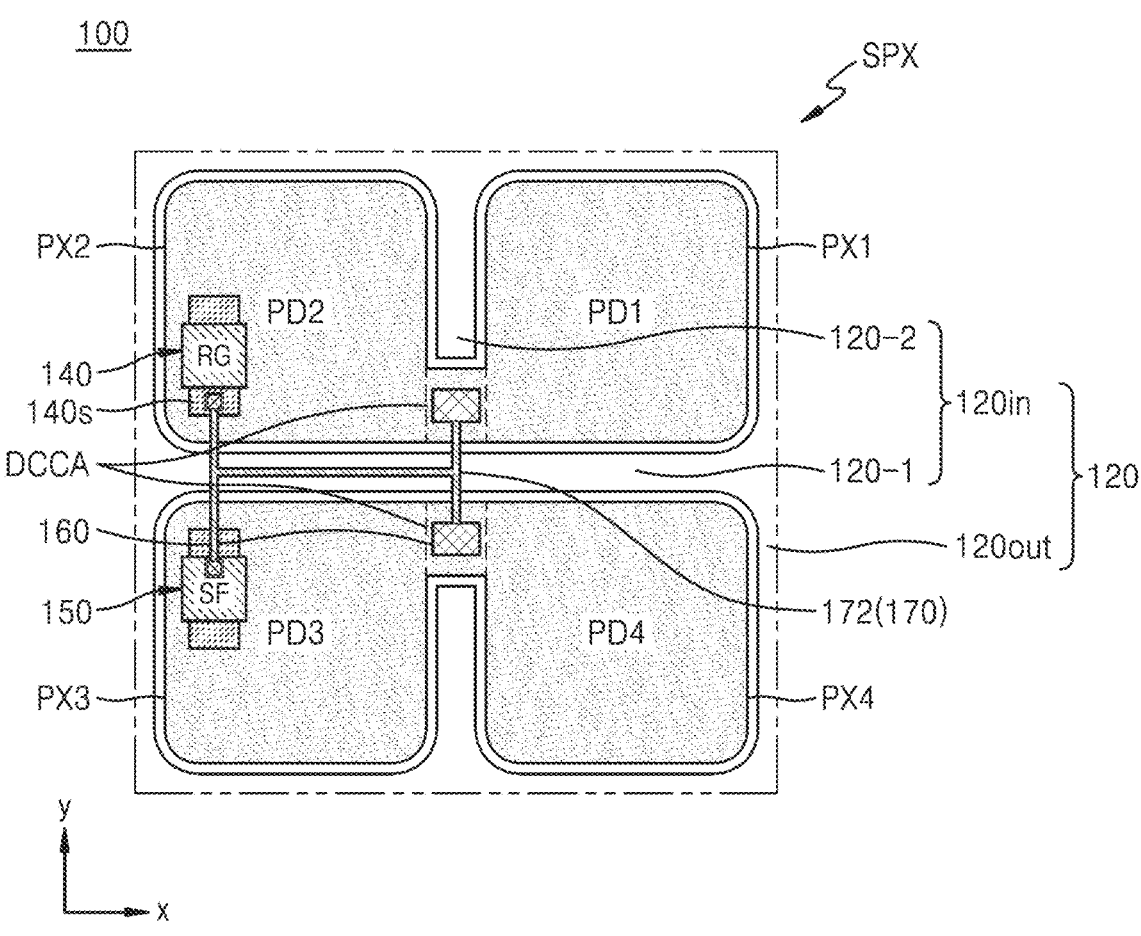
FIGS. 4A and 4B are conceptual views illustrating wiring connections between a floating diffusion region and pixel transistors in a common pixel of the image sensor of FIGS. 1B and 3.
Figure 4B:
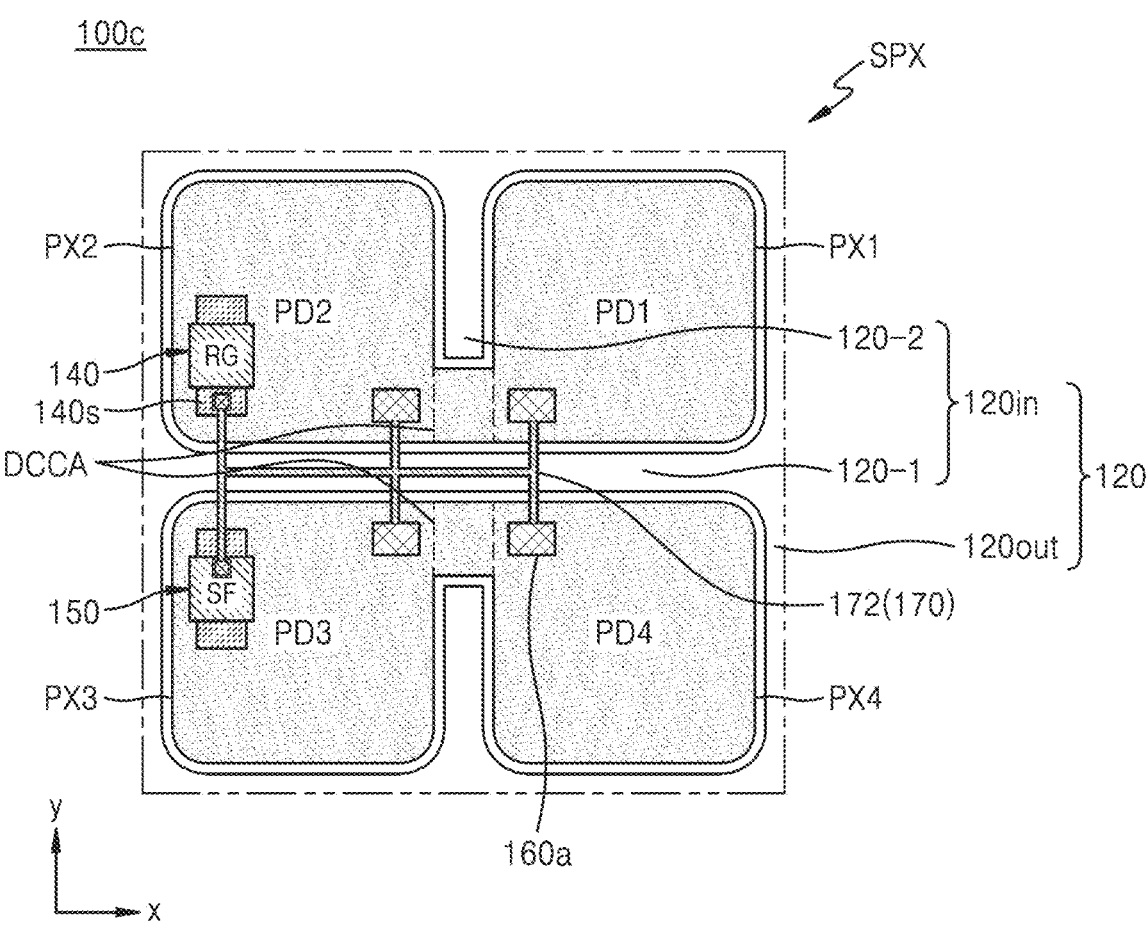

FIGS. 4A and 4B are conceptual diagrams illustrating wiring connections between an FD region and pixel transistors in a shared pixel of the image sensor of FIGS. 1B and 3.

Referring to FIG. 4A, in the image sensor 100 of this embodiment, two FD regions 160 at the center of a shared pixel SPX may be connected to each other through a wiring 172. In addition, the two FD regions 160 may be connected to the source region 140s of the reset transistor 140 and to the source follower gate SF of the source follower transistor 150 through the wiring 172. This connection relationship may be understood through the circuit diagram of FIG. 1A. For reference, in FIG. 4A, a square including an X in the source region 140s may indicate a contact.

By being connected through the wiring 172, the source region 140s of the reset transistor 140 may achieve an equipotential with the FD region 160. In addition, the source follower gate SF of the source follower transistor 150 may also have an equipotential with the FD region 160. Accordingly, the FD region 160, the source region 140s of the reset transistor 140, and the source follower gate SF may all form an equipotential.

Referring to FIG. 4B, in the image sensor 100c of this embodiment, four FD regions 160a at the center of the shared pixel SPX may be connected to each other through a wiring 172. In addition, the four FD regions 160a may be connected to the source region 140s of the reset transistor 140 and to the source follower gate SF of the source follower transistor 150 through the wiring 172.

So far, the structure of the shared pixel SPX sharing four unit pixels has been described. However, the shared pixels of the image sensor of this embodiment are not limited to a structure in which four unit pixels are shared. For example, in the image sensor of this embodiment, the shared pixel may share 2 unit pixels or 8 unit pixels. On the other hand, when the shared pixel includes two unit pixels and has the structure of FIG. 1B or 2B, each pair of pixels constitutes a shared pixel, and a reset transistor, a source follower transistor, and a selection transistor may be disposed in two unit pixels of each of the pixel pairs.

Figure 5A:
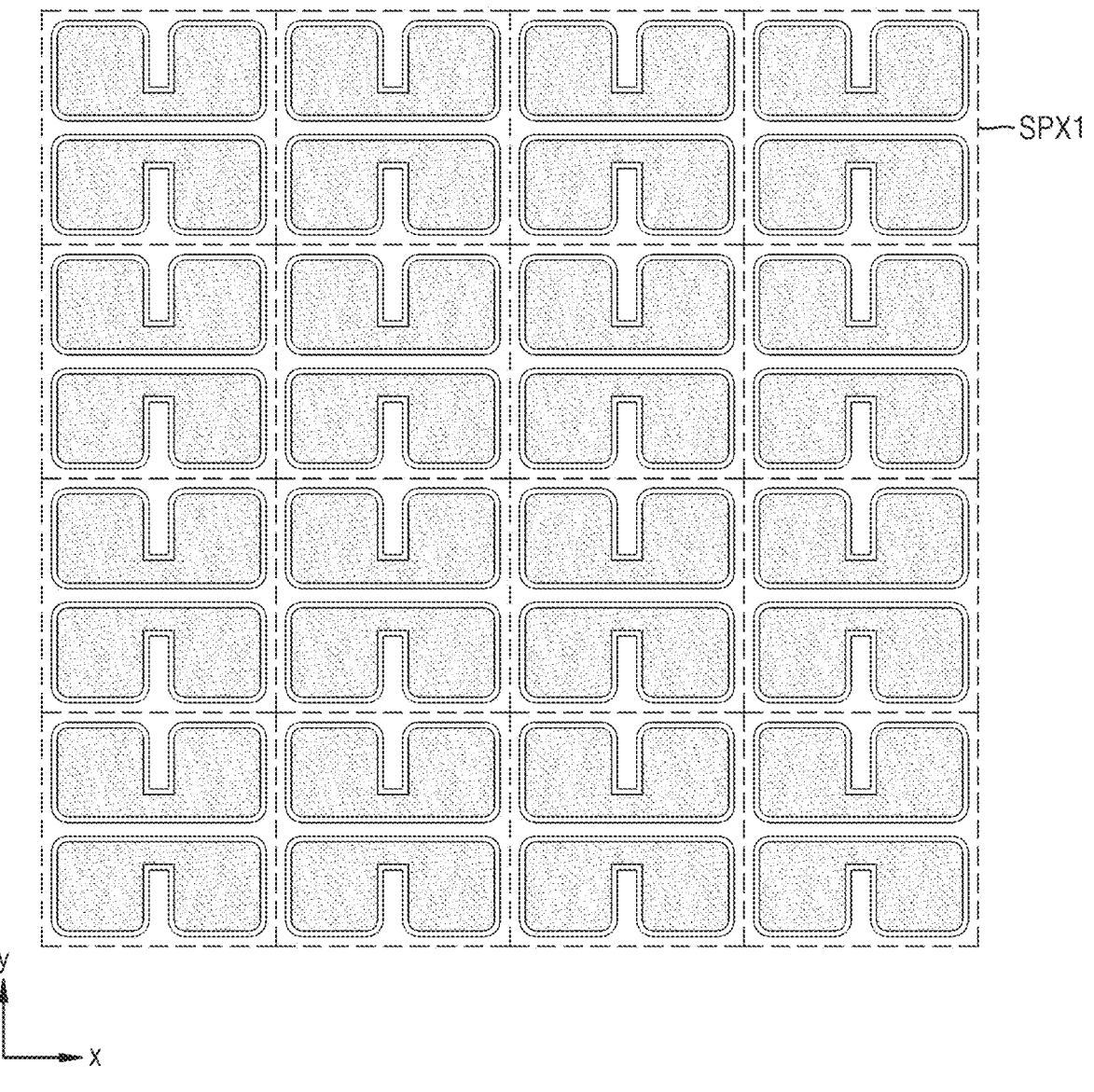
FIGS. 5A to 5C are plan views illustrating a structure in which shared pixels of the image sensor of FIG. 1B or 1C are arranged in a two-dimensional array structure.
Figure 5B:
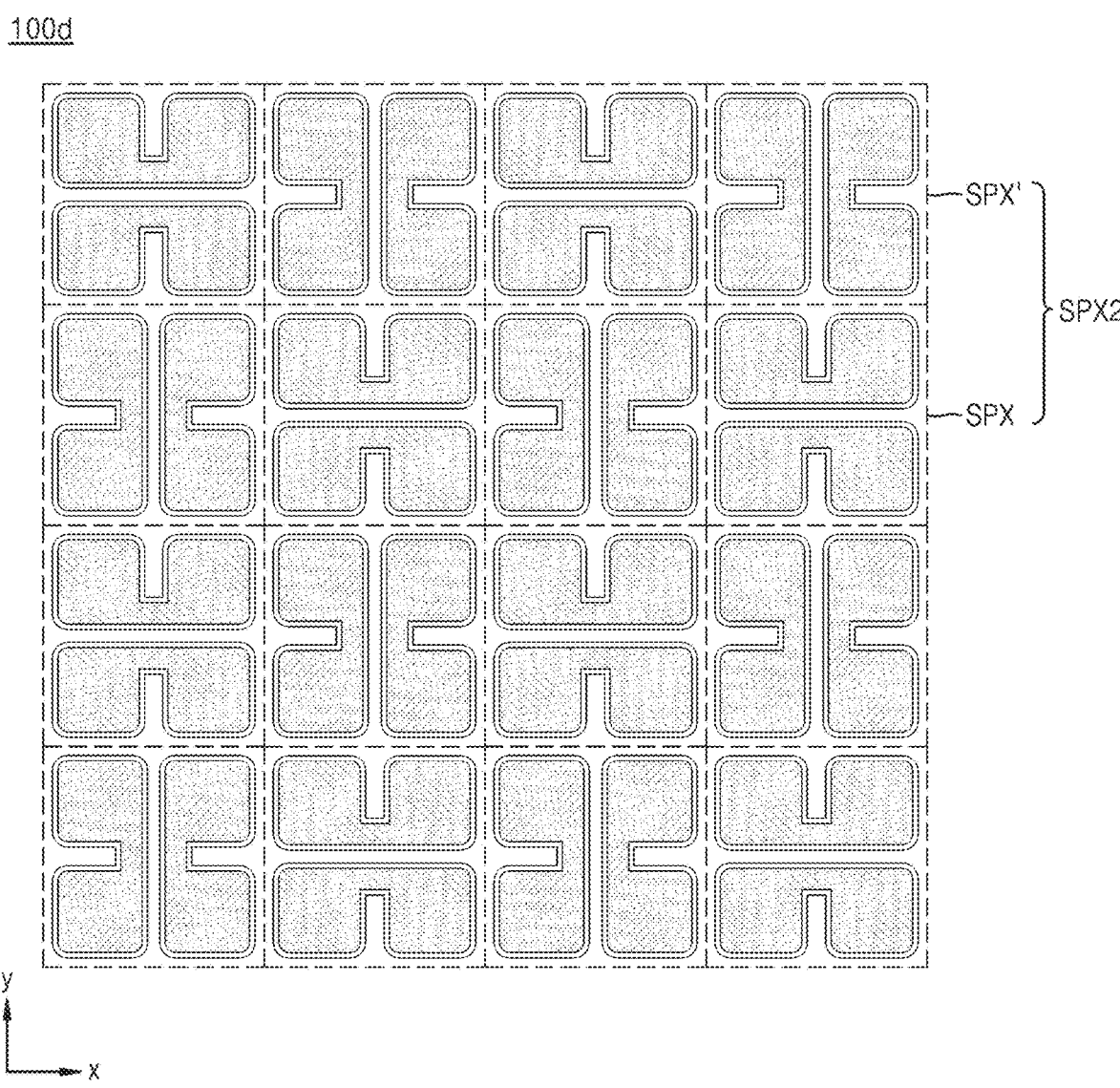
Figure 5C:
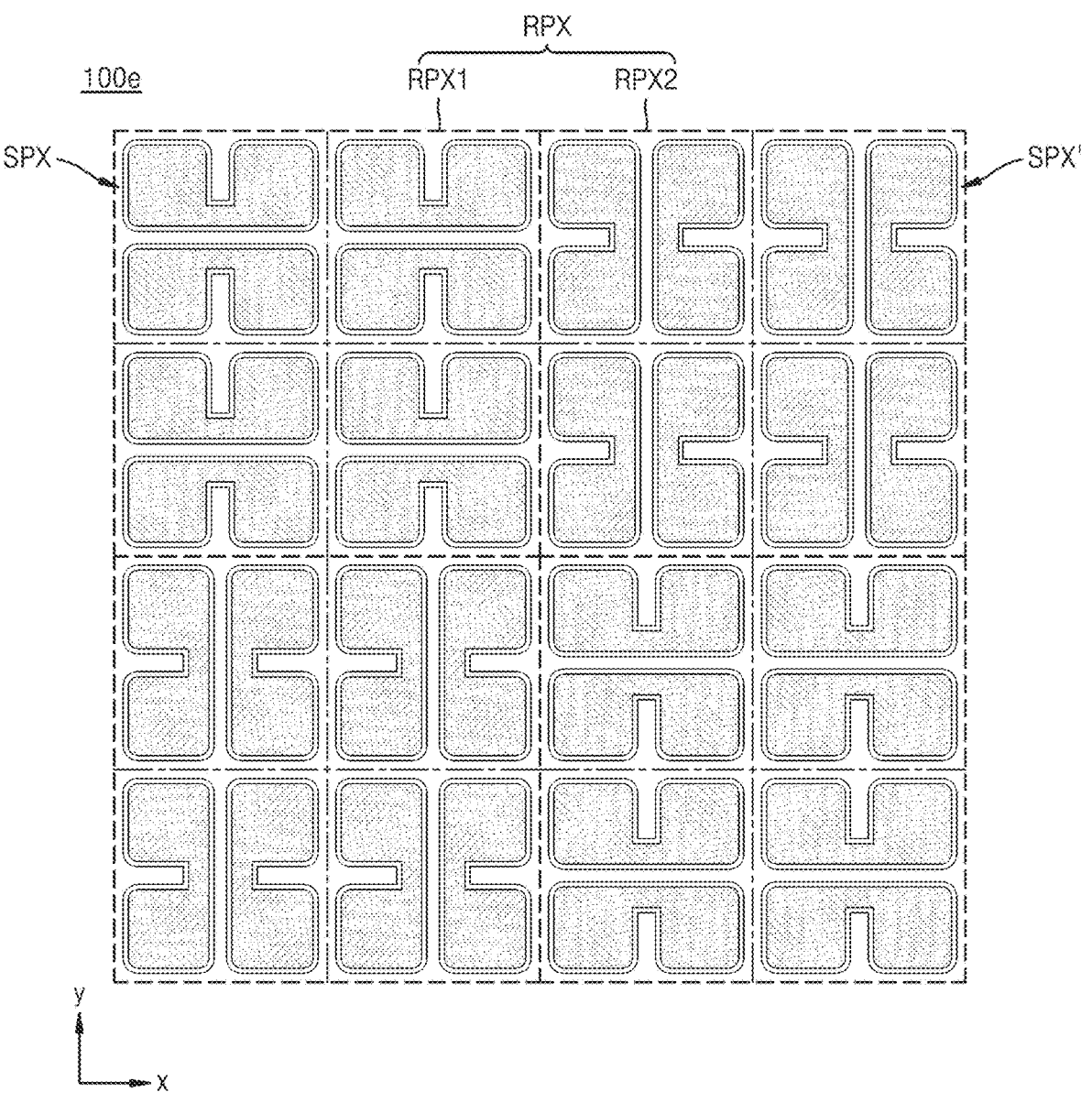

FIGS. 5A to 5C are plan views illustrating a structure in which shared pixels of the image sensor of FIG. 1B or 1C are arranged in a two-dimensional array structure. FIGS. 1B and 1C will be described together, and descriptions given above of FIGS. 1A to 4B are briefly given or omitted.

Referring to FIG. 5A, the image sensor 100 of this embodiment may include a plurality of first shared pixels SPX1 arranged in a two-dimensional array structure. For example, a plurality of first shared pixels SPX1 may be disposed in the x and y directions. In addition, two first shared pixels SPX1 adjacent in the x direction may have the same structure. Also, two first shared pixels SPX1 adjacent in the y direction may also have the same structure.

In the image sensor 100 of this embodiment, the first shared pixel SPX1 may have substantially the same shape as the shared pixel SPX of FIG. 1B or the shared pixel SPX' of FIG. 1C. FIG. 5A shows a first shared pixel SPX1 having the shape of the shared pixel SPX of FIG. 1B. Accordingly, the first DTI structure 120-1 of all first shared pixels SPX1 may have a structure extending in the x direction. Also, the second DTI structures 120-2 of the first shared pixels SPX1 adjacent in the y direction may face each other.

If the first shared pixel SPX1 has the shape of the shared pixel SPX' of FIG. 1C, the first DTI structure 120-1' of all first shared pixels SPX1 may have a structure extending in the y direction. Also, the second DTI structures 120-2' of the first shared pixels SPX1 adjacent in the x direction may face each other.

Referring to FIG. 5B, the image sensor 100d of this embodiment may include a plurality of second shared pixels SPX2 arranged in a 2D array structure. For example, a plurality of second shared pixels SPX2 may be disposed in the x and y directions. Furthermore, two second shared pixels SPX2 adjacent in the x direction may have different structures. Also, the two second shared pixels SPX2 adjacent in the y direction may also have different structures. For example, the second shared pixel SPX2 may include both the shared pixel SPX of FIG. 1B and the shared pixel SPX' of FIG. 1C. Also, in the plurality of second shared pixels SPX2, the shared pixel SPX of FIG. 1B and the shared pixel SPX' of FIG. 1C may be disposed adjacent to each other in the x direction, and the shared pixel SPX of FIG. 1B and the shared pixel SPX' of FIG. 1C may be disposed adjacent to each other in the y direction. Accordingly, the shared pixels SPX of FIG. 1B and the shared pixels SPX' of FIG. 1C are alternately disposed in the x direction, and also, the shared pixels SPX of FIG. 1B and the shared pixels SPX' of FIG. 1C may be alternately disposed in the y direction.

As the shared pixel SPX of FIG. 1B and the shared pixel SPX' of FIG. 1C are disposed adjacent to each other, in the x direction, the first DTI structure 120-1 of the shared pixel SPX of FIG. 1B may face the second DTI structure 120-2' of the shared pixel SPX' of FIG. 1C. Also, in the y direction, the first DTI structure 120-1' of the shared pixel SPX' of FIG. 1C may face the second DTI structure 120-2 of the shared pixel SPX of FIG. 1b.

Referring to FIG. 5C, in the image sensor 100e of this embodiment, the four shared pixels SPX and SPX' may form a 2*2 repeating structure RPX. The repeating structure RPX may include a first repeating structure RPX1 and a second repeating structure RPX2. In the x direction, the first repeating structure RPX1 and the second repeating structure RPX2 are alternately disposed, and also, in the y direction, the first repeating structure RPX1 and the second repeating structure RPX2 may be alternately arranged.

The first repeating structure RPX1 and the second repeating structure RPX2 may include different shared pixels. For example, the first repeating structure RPX1 may include four shared pixels SPX of FIG. 1B, and the second repeating structure RPX2 may include four shared pixels SPX' of FIG. 1C.

According to an embodiment, the first repeating structure RPX1 and the second repeating structure RPX2 each include two shared pixels SPX of FIG. 1B and two shared pixels SPX' of FIG. 1C, and may have different structures. For example, in the first repeating structure RPX1, the shared pixels SPX in FIG. 1B, the shared pixels SPX' in FIG. 1C, the shared pixels SPX in FIG. 1B, and the shared pixels SPX' in FIG. 1C are arranged clockwise from the upper left, and in the second repeating structure RPX2, the shared pixel SPX' of FIG. 1C, the shared pixel SPX of FIG. 1B, the shared pixel SPX' of FIG. 1C, and the shared pixel SPX of FIG. 1B may be arranged clockwise from the upper left.

In the image sensor of this embodiment, the 2D array structure of shared pixels is not limited to the above 2D array structures. For example, in the image sensor of this embodiment, various two-dimensional array structures of shared pixels may be implemented through various combinations of the shared pixels SPX of FIG. 1B and SPX' of FIG. 1C. In addition, the inventive concept is not limited to the arrangement structure of the FD region 160 of the shared pixel SPX of FIG. 1B and the shared pixel SPX' of FIG. 1C, and the arrangement structure of the FD region 160a of the shared pixel SPX of FIG. 3 may also be applied.

Figure 6A:
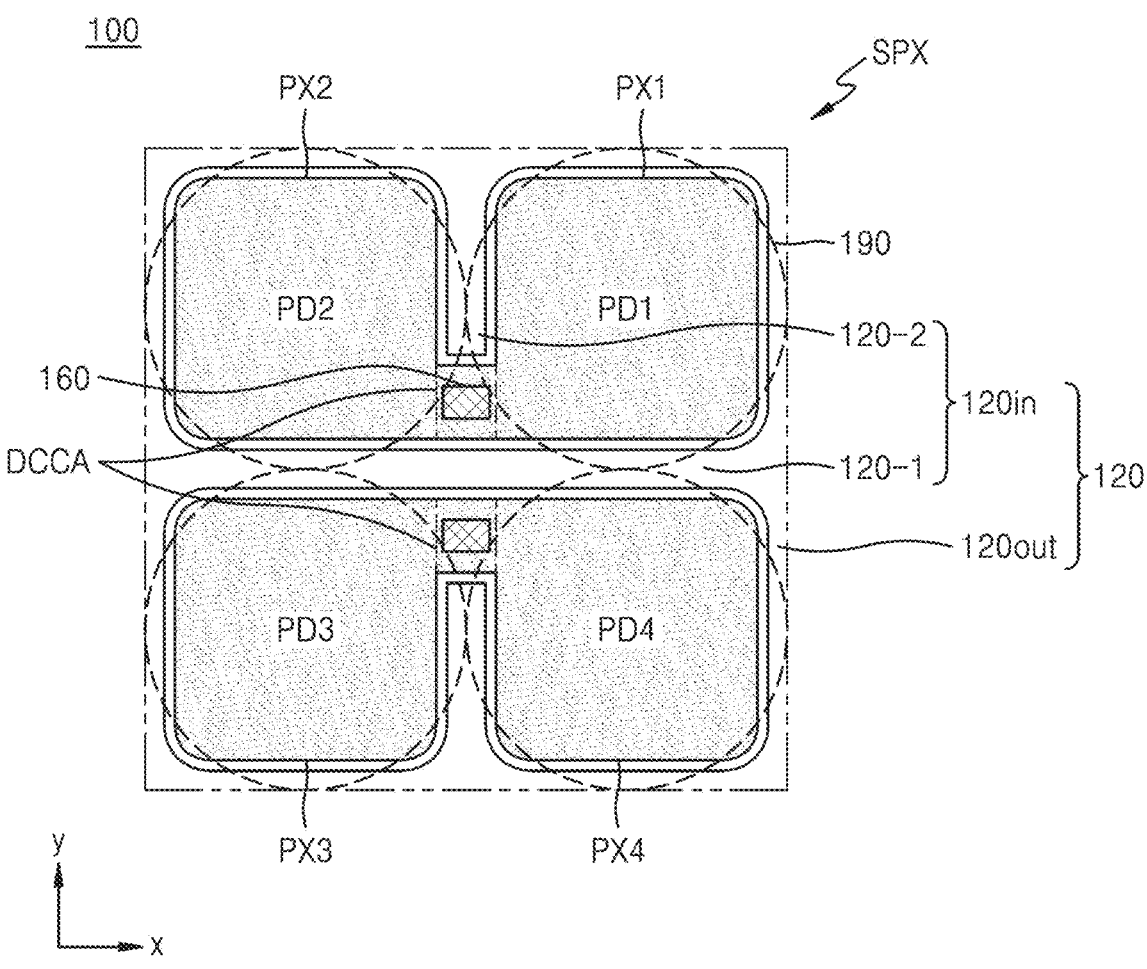
FIGS. 6A and 6B are conceptual diagrams showing structures of microlenses disposed in shared pixels of the image sensor of FIG. 1B.
Figure 6B:
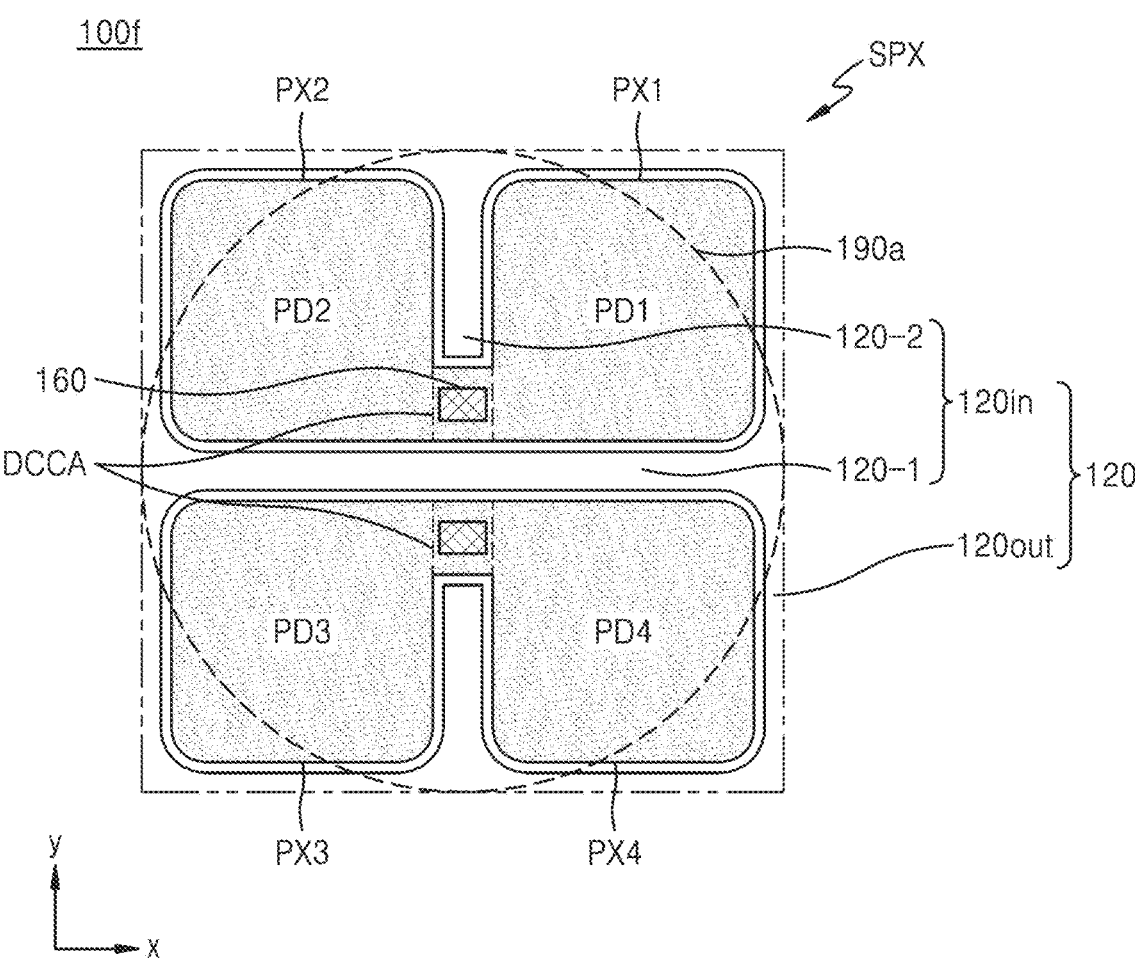

FIGS. 6A and 6B are conceptual diagrams showing structures of microlenses disposed in shared pixels of the image sensor of FIG. 1B. It will be described with reference to FIG. 1B, and the descriptions given above of FIGS. 1A to 5C are briefly given or omitted.

Referring to FIG. 6A, in the image sensor 100 of this embodiment, one microlens 190 may be disposed per unit pixel. For example, one microlens 190 may be disposed on each of the first to fourth unit pixels PX1 to PX4. Accordingly, as shown in FIG. 6A, in the image sensor 100 of this embodiment, four microlenses 190 may be disposed in the shared pixel SPX.

Referring to FIG. 6B, in the image sensor 100f of this embodiment, one microlens 190a may be disposed for each shared pixel. For example, one microlens 190a may be disposed to cover all of the first to fourth unit pixels PX1 to PX4. Accordingly, as shown in FIG. 6B, in the image sensor 100 of this embodiment, one microlens 190a may be disposed within the shared pixel SPX.

FIGS. 7A to 7D are conceptual diagrams showing structures of color filters disposed in shared pixels of the image sensor of FIG. 1B or 1C, and for convenience of description, PDs, DTI structures, and FD regions are omitted and only color filters are shown.

Figure 7A:
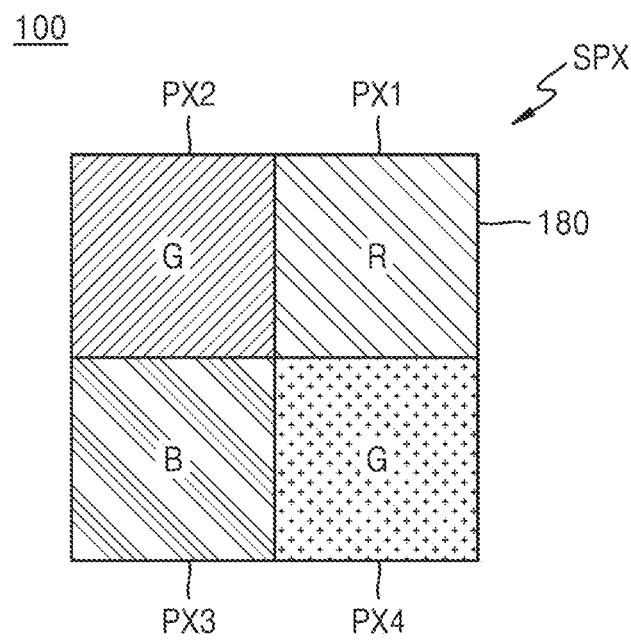
FIGS. 7A to 7D are conceptual diagrams illustrating structures of color filters disposed in shared pixels of the image sensor of FIG. 1B or 1C.

Referring to FIG. 7A, in an image sensor 100 of this embodiment, one color filter 180 may be disposed per unit pixel within the shared pixel SPX. For example, the color filters 180 may be arranged in an RGGB-based Bayer pattern. Here, R may mean a red color filter, G may mean a green color filter, and B may mean a blue color filter. Accordingly, in the RGGB-based Bayer pattern, as shown in FIG. 7A, R and B may be diagonally arranged and two Gs may be diagonally arranged. For example, R may be disposed in the first unit pixel PX1, G may be disposed in the second unit pixel PX2, B may be disposed in the third unit pixel PX3, and G may be disposed in the fourth unit pixel PX4.

Figure 7B:
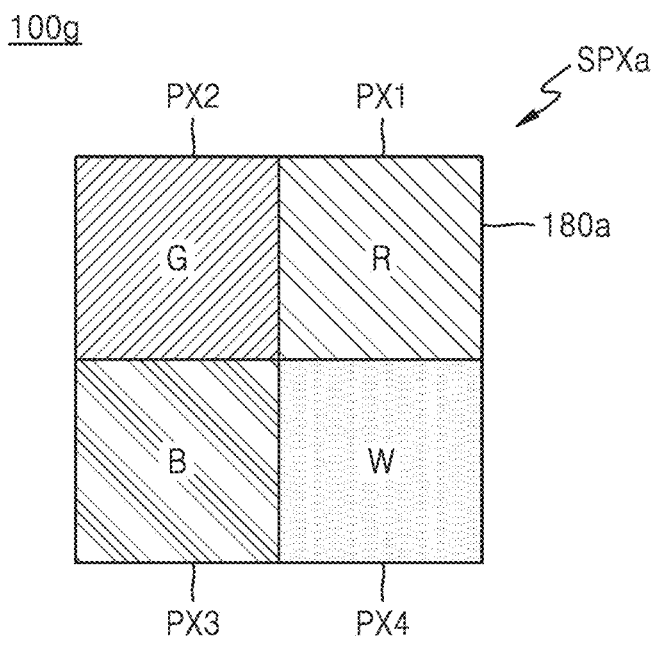

Referring to FIG. 7B, in an image sensor 100g of this embodiment, one color filter 180a may be disposed per unit pixel within the shared pixel SPXa. For example, the color filter 180a may be arranged in an RGBW-based Bayer pattern. Here, W may mean a white color filter. Accordingly, in the RGBW-based Bayer pattern, as shown in FIG. 7B, R and B may be arranged diagonally and G and W may be arranged diagonally. For example, R may be disposed in the first unit pixel PX1, G may be disposed in the second unit pixel PX2, B may be disposed in the third unit pixel PX3, and W may be disposed in the fourth unit pixel PX4.

Figure 7C:
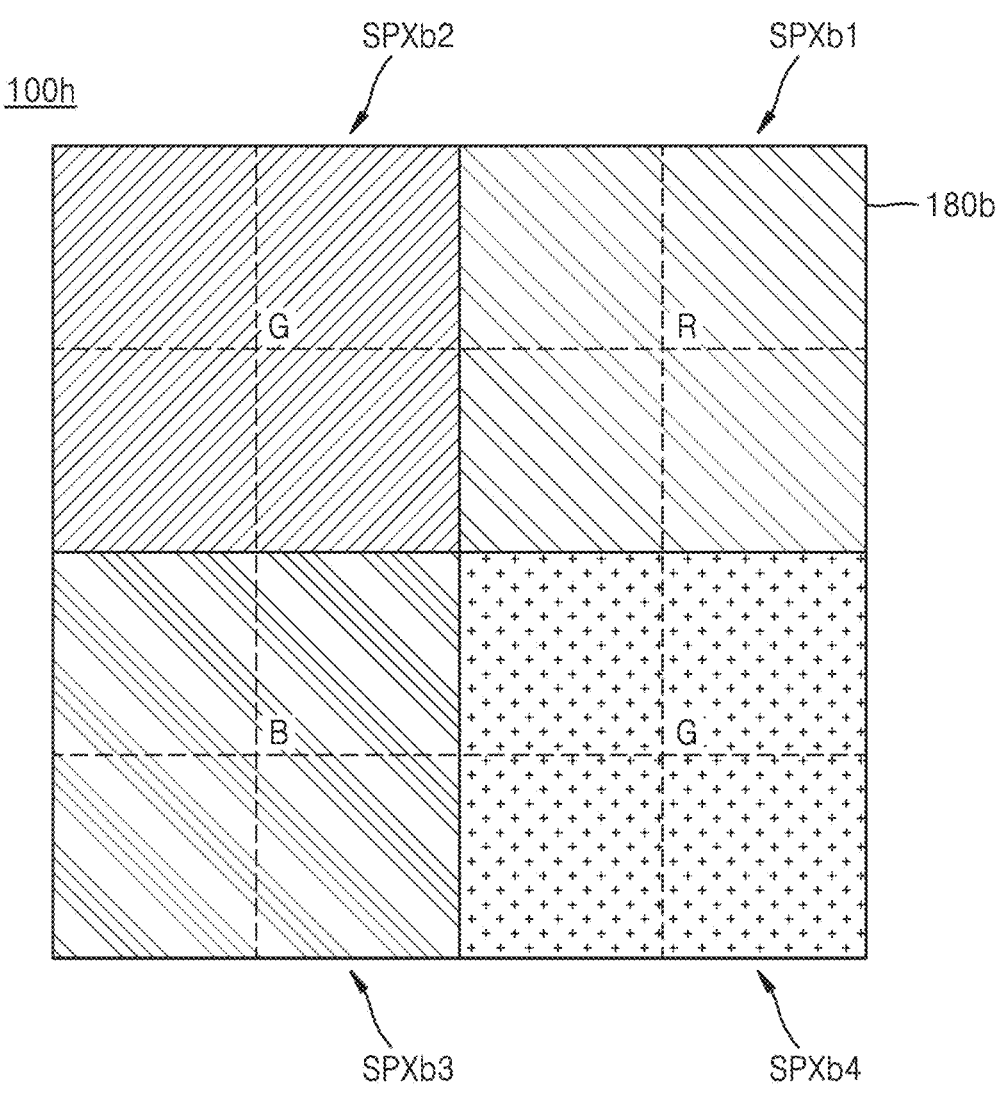

Referring to FIG. 7C, in an image sensor 100h according to this embodiment, one color filter 180b may be disposed for each shared pixel SPXb. That is, one color filter 180b may be disposed to cover all four unit pixels in the shared pixel SPXb. For example, the color filter 180b may be arranged in an RGGB-based tetra pattern. Accordingly, in the RGGB-based tetra pattern, as shown in FIG. 7C, R and B may be diagonally arranged and two Gs may be diagonally arranged. For example, R may be disposed in the first shared pixel SPXb1, G may be disposed in the second shared pixel SPXb2, B may be disposed in the third shared pixel SPXb3, and G may be disposed in the fourth shared pixel SPXb4.

Figure 7D:
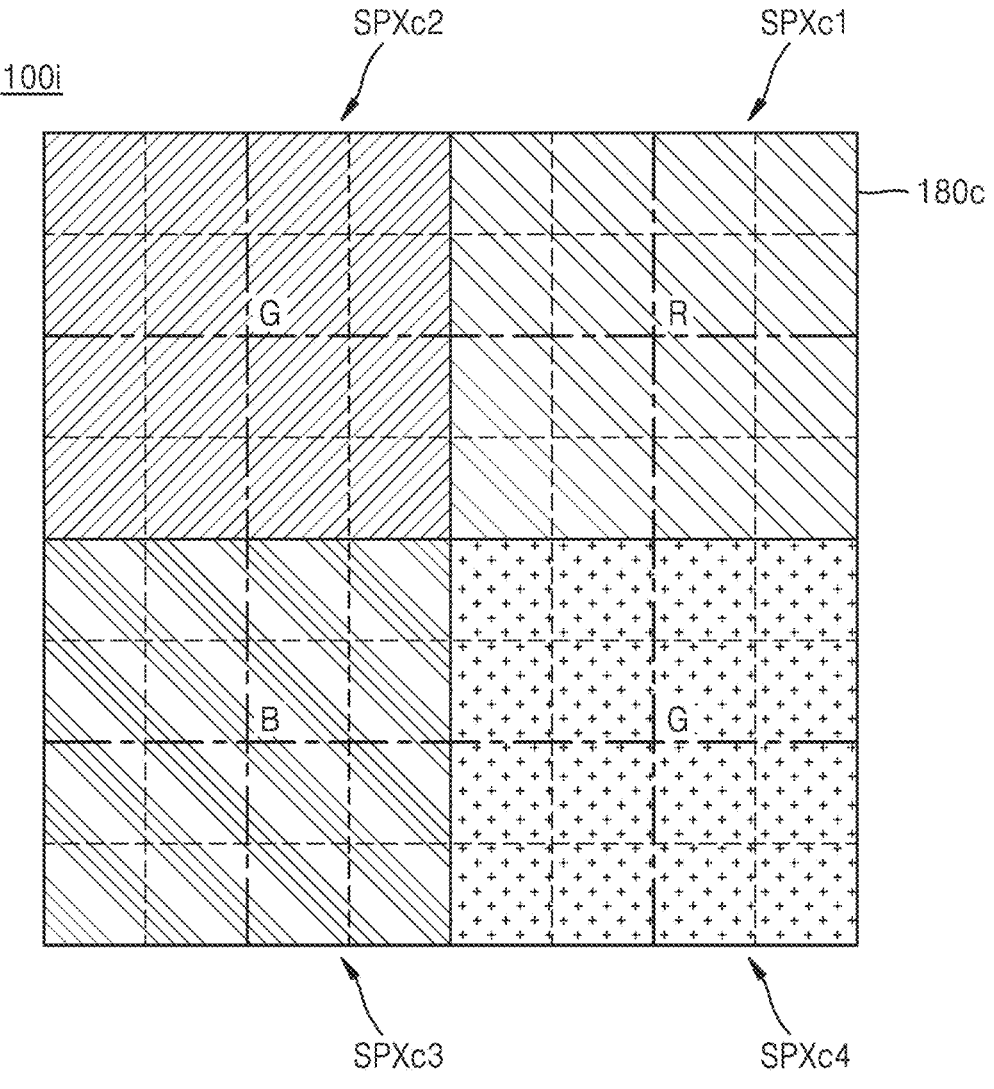

In an image sensor 100i according to the embodiment shown in FIG. 7D, one color filter 180c may be disposed for each of the four shared pixels SPXc. That is, one color filter 180c may be disposed to cover all 16 unit pixels within the four shared pixels SPXc. For example, the color filters 180c may be arranged in an RGGB-based tetra squared pattern. Accordingly, in the RGGB-based tetra square pattern, as shown in FIG. 7D, R and B may be arranged diagonally and two Gs may be arranged diagonally. For example, R may be disposed in four first shared pixels SPXc1, G may be disposed in four second shared pixels SPXc, B may be disposed on the four third shared pixels SPXc3, and G may be disposed on the four fourth shared pixels SPXc4.

In addition, in the image sensor of this embodiment, the arrangement structure of the color filters is not limited to the above arrangement structures. For example, in the image sensor of this embodiment, the color filters may be arranged in an RGBW-based tetra pattern or an RGBW-based tetra squared pattern.

Figure 8:
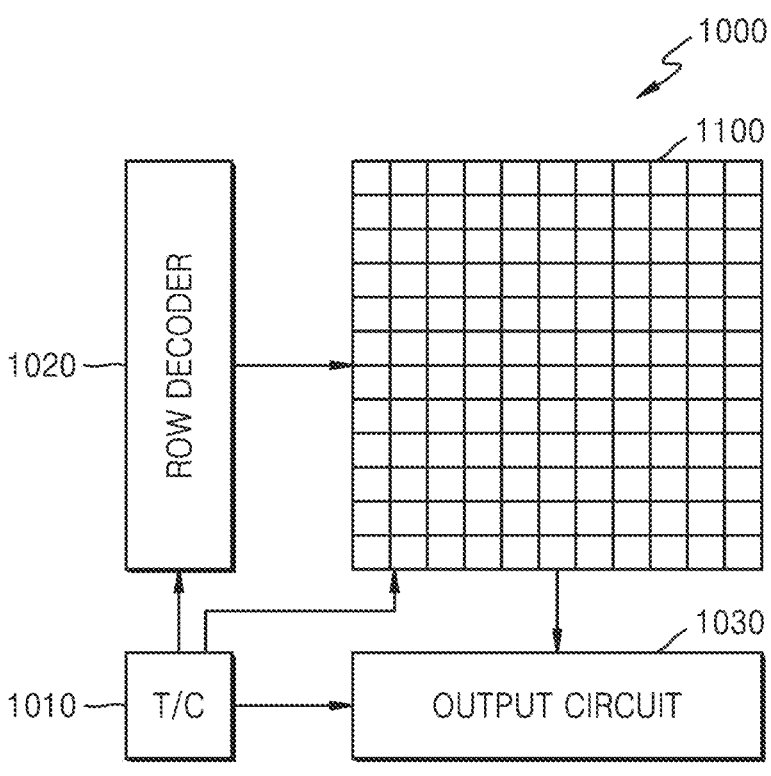
FIG. 8 is a block structure diagram of an entire image sensor according to an embodiment.

FIG. 8 is a block structure diagram of an entire image sensor according to an embodiment. FIGS. 1A to 1C are also referred to, and descriptions given above of FIGS. 1A to 7D are briefly given or omitted.

Referring to FIG. 8, an image sensor 1000 according to this embodiment may include a pixel array 1100, a timing controller T/C 1010, a row decoder 1020, and an output circuit 1030. The image sensor 1000 of this embodiment may be, for example, a charge coupled device (CCD) image sensor or a complementary metal oxide semiconductor (CMOS) image sensor.

On the other hand, the image sensor 1000 of this embodiment may be any one of the image sensors 100, 100a to 100i of FIGS. 1B, IC, 2C, 3, 5B, 5C, 6B, and 7B to 7D. Accordingly, the pixel array 1100 may include a plurality of unit pixels and/or shared pixels SPX arranged in a two-dimensional array structure along a plurality of rows and a plurality of columns. The row decoder 1020 may select one row from among a plurality of rows of the pixel array 1100 in response to a row address signal output from the timing controller 1010. The output circuit 1030 may output image signals in column units from a plurality of unit pixels and/or shared pixels SPX arranged along the selected row. The output circuit 1030 may include an A/D converter (ADC). For example, the output circuit 1030 may include a plurality of ADCs arranged for each column between the column decoder and the pixel array 1100, or one ADC disposed at an output terminal of the column decoder. Depending on embodiments, the timing controller 1010, the row decoder 1020, and the output circuit 1030 may be implemented as a single chip or may be implemented as separate chips.

The image sensor 1000 of this embodiment may have a structure in which the shared pixel SPX is completely separated into pixel pairs through the first DTI structure 120-1, and also, the pixel pair is partially separated into unit pixels through the second DTI structure 120-2. Based on the structure of the shared pixel SPX, the image sensor 1000 of this embodiment may provide an overflow path between two adjacent unit pixels while limiting and/or minimizing light loss. Accordingly, it is possible to improve the sensing accuracy of the amount of charge in each of the PDs.

Figure 9:
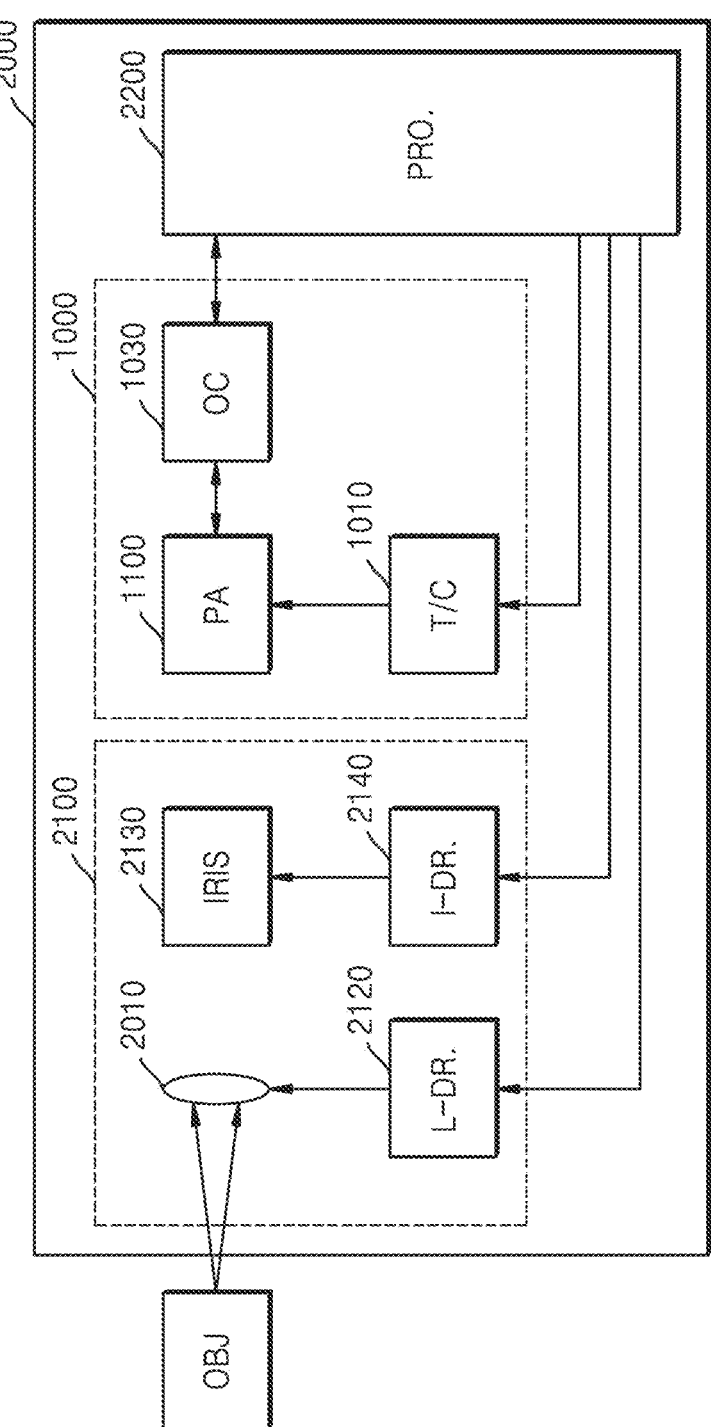
FIG. 9 is a block diagram of an electronic device including an image sensor according to an embodiment.

FIG. 9 is a block diagram of an electronic device including an image sensor according to an embodiment. Referring to FIGS. 1A to 1C and FIG. 8, descriptions given above of FIGS. 1A to 8 are briefly given or omitted.

Referring to FIG. 9, an electronic device 2000 (hereinafter, simply referred to as an 'electronic device') including an image sensor according to the present embodiment may include an imaging section 2100, an image sensor 1000, and a processor 2200. The electronic device 2000 may be, for example, a camera. The imaging unit 2100 may form an optical image by focusing light reflected from the object OBJ. The imaging section 2100 may include an objective lens 2010, a lens driver 2120, an iris 2130, and an iris driver 2140. In FIG. 9, only one lens is shown for convenience, but in reality, the objective lens 2010 may include a plurality of lenses having different sizes and shapes. In some embodiments, the electronic device 2000 may be a mobile camera, and in the mobile camera, the iris 2130 and the iris driver 2140 may be omitted.

The lens driver 2120 may communicate information about focus detection with the processor 2200 and adjust the position of the objective lens 2010 according to a control signal provided from the processor 2200. The lens driver 2120 may move the objective lens 2010 to adjust the distance between the objective lens 2010 and the subject OBJ, or adjust the position of each individual lens within the objective lens 2010. As the lens driver 2120 drives the objective lens 2010, the focus of the subject OBJ may be adjusted. In addition, the lens driver 2120 may receive autofocus (AF) information and adjust positions of individual lenses in the objective lens 2010 to focus.

The iris driver 2140 may communicate information about the amount of light with the processor 2200 and may adjust the iris 2130 according to a control signal provided from the processor 2200. For example, the iris driver 2140 may increase or decrease the aperture of the iris 2130 according to the amount of light entering the electronic device 2000 through the objective lens 2010. Also, the iris driver 2140 may adjust the opening time of the iris 2130.

The image sensor 1000 may generate an electrical image signal based on the intensity of incident light. The image sensor 1000 may be, for example, one of the image sensors 100, 100a to 100i of FIGS. 1B, 1C, 2C, 3, 5B, 5C, 6B, and 7B to 7D. Also, the image sensor 1000 may be the image sensor 1000 of FIG. 8. Accordingly, the image sensor 1000 may include a pixel array 1100, a timing controller 1010, and an output circuit 1030. Also, although not shown in FIG. 9, the image sensor 1000 may further include a row decoder 1020.

The processor 2200 may control all operations of the electronic device 2000 and may perform image processing functions. For example, the processor 2200 may provide control signals for the operation of each component to the lens driver 2120, the iris driver 2140, the timing controller 1010, and the like.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. An image sensor comprising:

four unit pixels constituting a shared pixel in a 2*2 structure; and a Deep Trench Isolation (DTI) structure isolating the four unit pixels from each other, wherein the DTI structure includes an inner DTI structure inside the shared pixel and an outer DTI structure surrounding the shared pixel, the inner DTI structure includes a first DTI structure and a second DTI structure, the first DTI structure passes through a center of the shared pixel and extends in a first direction or a second direction, the second direction is perpendicular to the first direction, and the second DTI structure extends toward the center of the shared pixel in a direction perpendicular to a direction in which the first DTI structure extends, the shared pixel includes a DTI Center Cut (DCC) region between the first DTI structure and the second DTI structure in a direction in which the second DTI structure extends.

2. The image sensor of claim 1, wherein the first DTI structure divides the shared pixel into two pixel pairs, the second DTI structure divides a pixel pair, among the two pixel pairs, into two unit pixels that are connected to each other through the DCC region in a central portion of the shared pixel.

3. The image sensor of claim 2, wherein the DCC region includes a Floating Diffusion (FD) region.

4. The image sensor of claim 2, wherein each of the four unit pixels includes an FD region adjacent to the DCC region.

5. The image sensor of claim 1, wherein the shared pixel is among a plurality of shared pixels arranged in the first direction and the second direction in a two-dimensional array structure, the plurality of shared pixels include two shared pixels adjacent to each other in the first direction and two shared pixels adjacent to each other in the second direction, which are separated from each other by the outer DTI structure, the inner DTI structure is one inner DTI structure among inner DTI structures in the DTI structure, and the DTI structure includes one of the inner DTI structures in each of the plurality of shared pixels, the inner DTI structures of the two shared pixels adjacent to each other in the first direction and the inner DTI structures of the two shared pixels adjacent to each other in the second direction have same structures or structures rotated by 90° with respect to each other.

6. The image sensor of claim 5, wherein the inner DTI structures of the two shared pixels adjacent to each other in the first direction and the inner DTI structures of the two shared pixels adjacent to each other in the second direction have same structures, in the inner DTI structures of the two shared pixels adjacent to each other in the first direction and the inner DTI structures of the two shared pixels adjacent to each other in the second direction, the first DTI structure extends in the first direction and the second DTI structure extends in the second direction, the inner DTI structures of the two shared pixels adjacent to each other in the first direction together provide first DTI structures of the two shared pixels adjacent to each other in the first direction and the first DTI structures of the two shared pixels adjacent to each other in the first direction are connected to each other, and the inner DTI structures of the two shared pixels adjacent to each other in the second direction together provide second DTI structures of the two shared pixels adjacent to each other in the second direction and the second DTI structures of the two shared pixels adjacent to each other in the second direction are connected to each other.

7. The image sensor of claim 5, wherein the inner DTI structures of the two shared pixels adjacent to each other in the first direction and the inner DTI structures of the two shared pixels adjacent to each other in the second direction have the structures rotated by 90° with respect to each other, the two shared pixels adjacent to each other in the first direction comprise a first shared pixel and a second shared pixel, in the first shared pixel, the first DTI structure extends in the first direction and the second DTI structure extends in the second direction, in the second shared pixel, the first DTI structure extends in the second direction and the second DTI structure extends in the first direction, and the two shared pixels adjacent to each other in the second direction comprise the first shared pixel and a third shared pixel, and in the third shared pixel, the first DTI structure extends in the second direction and the second DTI structure extends in the first direction.

8. The image sensor of claim 1, wherein the shared pixel is among a plurality of shared pixels arranged in the first direction and the second direction in a two-dimensional array structure, in the plurality of shared pixels, four shared pixels having a two*two structure constitute a repeating structure among a plurality of repeating structures in the two-dimensional array structure, the plurality of repeating structures include two repeating structures adjacent to each other in the first direction and two repeating structures adjacent to each other in the second direction, the two repeating structures adjacent to each other in the first direction comprise a first repeating structure and a second repeating structure, in each of the four shared pixels of the first repeating structure, the first DTI structure extends in the first direction and the second DTI structure extends in the second direction, in each of the four shared pixels of the second repeating
structure, the first DTI structure extends in the second
direction and the second DTI structure extends in the
first direction,
the two repeating structures adjacent to each other in the
second direction comprise the first repeating structure
and a third repeating structure, and
in each of the four shared pixels of the third repeating
structure, the first DTI structure extends in the second
direction and the second DTI structure extends in the
first direction.
9. The image sensor of claim 1, further comprising:
one microlens per unit pixel among the four unit pixels or
one microlens disposed per shared pixel.
10. The image sensor of claim 1, wherein
the DTI structure has a Frontside DTI (FDTI) structure or
a Backside DTI (BDTI) structure.
11. The image sensor of claim 1, further comprising:
color filters, wherein
the four unit pixels are among a plurality of unit pixels,
the color filters are on the plurality of unit pixels,
the color filters are arranged in a Bayer, Tetra, or tetra
squared pattern,
the color filters are based on one red (R) filter, two green
(G) filters, and one blue (B) filter, or one R filter, one
G filter, one B filter, and one white (W) filter.
12. The image sensor of claim 1, wherein a width of the
DCC region in the direction in which the second DTI
structure extends is about 10% to about 90% of a width of
a corresponding one of the four unit pixels.
13. An image sensor comprising:
a plurality of unit pixels,
the plurality of unit pixels each including a photodiode
(PD),
the plurality of unit pixels being arranged in groups of
four unit pixels constituting a shared pixel in a 2*2
structure,
the shared pixel including at least two Floating Diffu-
sion (FD) regions within the shared pixel, a Transfer
Gate (TG) on each of the four unit pixels of the
shared pixel and adjacent to one of the at least two
FD regions, a Reset Gate (RG) on at least one of the
four unit pixels of the shared pixel, a Source Fol-
lower Gate (SF) on at least one of the four unit pixels
adjacent to the RG and disposed on an outer portion
of the shared pixel, and a DTI Center Cut (DCC)
region; and
a Deep Trench Isolation (DTI) structure separating the
plurality of unit pixels from each other, wherein
the DTI structure comprises a first DTI structure and a
second DTI structure,
the first DTI structure passes through a center of the
shared pixel and extends in a first direction or a second
direction,
the second direction is perpendicular to the first direction,
the second DTI structure extends toward a center of the
shared pixel in a direction perpendicular to a direction
in which the first DTI structure extends, and
the DTI Center Cut (DCC) region is between the first DTI
structure and the second DTI structure in a direction in
which the second DTI structure extends.
14. The image sensor of claim 13, wherein
the first DTI structure divides the shared pixel into two
pixel pairs,
the second DTI structure divides a pixel pair, among the
two pixel pairs, into two unit pixels among the plurality
of unit pixels, the two unit pixels of the pixel pair are connected to each
other in a central portion of the shared pixel by the
DCC region,
each FD region of the at least two FD regions is in the
DCC region of each of the two pixel pairs or each FD
region of the at least two FD regions is on a corre-
sponding one of the four unit pixels of the shared pixel
and adjacent to the DCC region.
15. The image sensor of claim 13, wherein
the shared pixel is among a plurality of shared pixels
arranged in the first direction and the second direction
in a two-dimensional array structure,
the plurality of shared pixels include two shared pixels
adjacent to each other in the first direction and two
shared pixels adjacent to each other in the second
direction, which are separated from each other by the
DTI structure,
the first DTI structure and the second DTI structure are an
inner DTI structure in the shared pixel among inner
DTI structures in the plurality of shared pixels, and
the inner DTI structures of the two shared pixels adjacent
to each other in the first direction and the inner DTI
structures of the two shared pixels adjacent to each
other the second direction have same structures or
structures rotated by 90° with respect to each other.
16. The image sensor of claim 13, wherein
the shared pixel is among a plurality of shared pixels
arranged in the first direction and the second direction
in a two-dimensional array structure,
in the plurality of shared pixels, four shared pixels having
a two*two structure constitute a repeating structure
among a plurality of repeating structures in the two-
dimensional array structure,
the plurality of repeating structures include two repeating
structures adjacent to each other in the first direction
and two repeating structures adjacent to each other in
the second direction,
the two repeating structures adjacent to each other in the
first direction comprise a first repeating structure and a
second repeating structure,
in the four shared pixels of the first repeating structure, the
first DTI structure extends in the first direction and the
second DTI structure extends in the second direction,
in the four shared pixels of the second repeating structure,
the first DTI structure extends in the second direction
and the second DTI structure extends in the first
direction,
the two repeating structures adjacent to each other in the
second direction comprise the first repeating structure
and a third repeating structure, and
in the four shared pixels of the third repeating structure,
the first DTI structure extends in the second direction
and the second DTI structure extends in the first
direction.
17. An image sensor comprising:
four unit pixels constituting a shared pixel in a 2*2
structure,
the shared pixel including at least two Floating Diffu-
sion (FD) regions disposed within the shared pixel,
and a Transfer Gate (TG) on each of the four unit
pixels and disposed adjacent to one of the at least two
FD regions, and a DTI Center Cut (DCC) region; and
a Deep Trench Isolation (DTI) structure separating the
four unit pixels from each other, wherein
the DTI structure includes a first DTI structure and a
second DTI structure, the first DTI structure passes through a center of the shared pixel and extends in a first direction or a second direction, the second direction is perpendicular to the first direction, the first DTI structure divides the shared pixel into two pixel pairs, the second DTI structure extending toward the center of the shared pixel in a direction perpendicular to the direction in which the first DTI structure extends and divides a pixel pair, among the two pixel pairs, into two unit pixels among the four unit pixels of the shared pixel, and the DTI Center Cut (DCC) region is between the first DTI structure and the second DTI structure in the direction in which the second DTI structure extends.

18. The image sensor of claim 17, wherein the two unit pixels of the pixel pair are connected to each other through the DCC region in a central portion of the shared pixel, and each FD region of the at least two FD regions is in the DCC region of each of the two pixel pairs or each FD region of the at least two FD regions is on a corresponding one of the four unit pixels of the shared pixel and adjacent to the DCC region.

19. The image sensor of claim 17, wherein the shared pixel is among a plurality of shared pixels arranged in the first direction and the second direction in a two-dimensional array structure, the plurality of shared pixels include two shared pixels adjacent to each other in the first direction and two shared pixels adjacent to each other in the second direction, which are separated from each other by an outer DTI structure of the DTI structure, the first DTI structure and the second DTI structure are an inner DTI structure in the shared pixel among inner DTI structures in the plurality of shared pixels, and the inner DTI structures of the two shared pixels adjacent to each other in the first direction and the inner DTI structures of the two shared pixels adjacent to each other in the second direction have same structures or structures rotated by 90° with respect to each other.

20. The image sensor of claim 17, wherein the shared pixel is among a plurality of shared pixels arranged in the first direction and the second direction in a two-dimensional array structure, in the plurality of shared pixels, four shared pixels having a two*two structure constitute a repeating structure among a plurality of repeating structures in the two-dimensional array structure, the plurality of repeating structures include two repeating structures adjacent to each other in the first direction and two repeating structures adjacent to each other in the second direction, the two repeating structures adjacent to each other in the first direction comprise a first repeating structure and a second repeating structure, in the four shared pixels of the first repeating structure, the first DTI structure extends in the first direction and the second DTI structure extends in the second direction, in the four shared pixels of the second repeating structure, the first DTI structure extends in the second direction and the second DTI structure extends in the first direction, the two repeating structures adjacent to each other in the second direction comprise the first repeating structure and a third repeating structure, in each of the four shared pixels of the third repeating structure, the first DTI structure extends in the second direction and the second DTI structure extends in the first direction.

* * * * *